United States Patent
Kamata et al.

Patent Number: 6,086,945
Date of Patent: Jul. 11, 2000

[54] METHOD OF FORMING POLYCRYSTALLINE SILICON THIN LAYER

[75] Inventors: Atsushi Kamata, Fujisawa; Hiroki Inagaki; Seiichi Suenaga, both of Yokohama; Hiromitsu Takeda, Tokyo, all of Japan

[73] Assignee: Kabushiki Kaisha Toshiba, Kawasaki, Japan

[21] Appl. No.: 09/255,873

[22] Filed: Feb. 23, 1999

[30] Foreign Application Priority Data

Mar. 13, 1998 [JP] Japan .................................. 10-062626

[51] Int. Cl.$^7$ ............................... B05D 1/02; B05D 3/02; B05D 1/36

[52] U.S. Cl. ...................... 427/74; 427/204; 427/255.18; 427/376.2; 427/419.2; 427/419.7; 427/452; 427/568; 427/578

[58] Field of Search ..................................... 427/574, 578, 427/568, 204, 376.2, 419.2, 419.7, 255.18, 74, 452

[56] References Cited

U.S. PATENT DOCUMENTS

| | | | |
|---|---|---|---|
| 4,003,770 | 1/1977 | Janowiecki et al. | 148/174 |
| 4,407,858 | 10/1983 | Hanke et al. | 427/86 |
| 5,273,911 | 12/1993 | Sasaki et al. | 437/4 |
| 5,866,471 | 2/1999 | Beppu et al. | 438/502 |

FOREIGN PATENT DOCUMENTS 57-183075  11/1982  Japan .

OTHER PUBLICATIONS

S. Sivoththaman, et al. "Optical Lamp Recrystallization Of Plasma–Sprayed Silicon Deposits On Different Substrates", Mat. Res. Bull., vol. 27, 1992, pp. 425–430.

Fumitaka Tamura, et al. "Fabrication Of Poly–Crystalline Silicon Films Using Plasma Spray Method", Solar Energy Materials And Solar Cells, vol. 34, pp. 263–270.

Tamura et al., "Fabrication of poly–crystalline silicon films using plasma spray method", Solar Energy Materials And Solar Cells, vol. 34, pp. 263–270, 1994.

Japanese patent abstract 07278814 by Osaka Gas, abstract, use sections, Oct. 1995.

*Primary Examiner*—Shrive Beck
*Assistant Examiner*—Michael Barr
*Attorney, Agent, or Firm*—Oblon, Spivak, McClelland, Maier & Neustadt, P.C.

[57] ABSTRACT

A method of forming a polycrystalline silicon thin layer, which comprises the steps of forming a silicon thin film on a surface of a heat resistant substrate by making use of polycrystalline silicon fine particles as a raw material, and heating the silicon thin film thereby to recrystallize the silicon thin film and hence to enlarge an average particle diameter of the polycrystalline silicon fine particles. The silicon thin film is formed by depositing the polycrystalline silicon fine particles directly on the surface of the substrate, and meets a relationship represented by the following formula (1)

$$W_A/(V_S \cdot d_S) \geq 0.95 \qquad (1)$$

wherein $W_A$ is the weight of the polycrystalline silicon fine particles which is actually deposited on the surface of the substrate, $V_S$ is a volume of the silicon thin film which is deposited on the surface of the substrate, and $d_S$ is a density of silicon (Si).

24 Claims, 5 Drawing Sheets

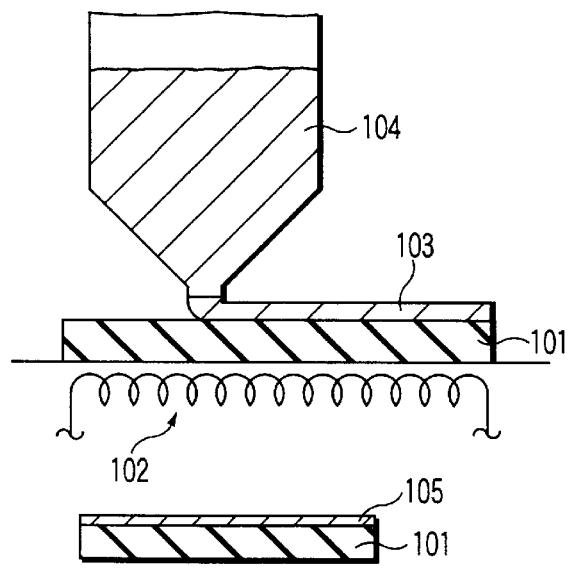
FIG. 9A
FIG. 9B
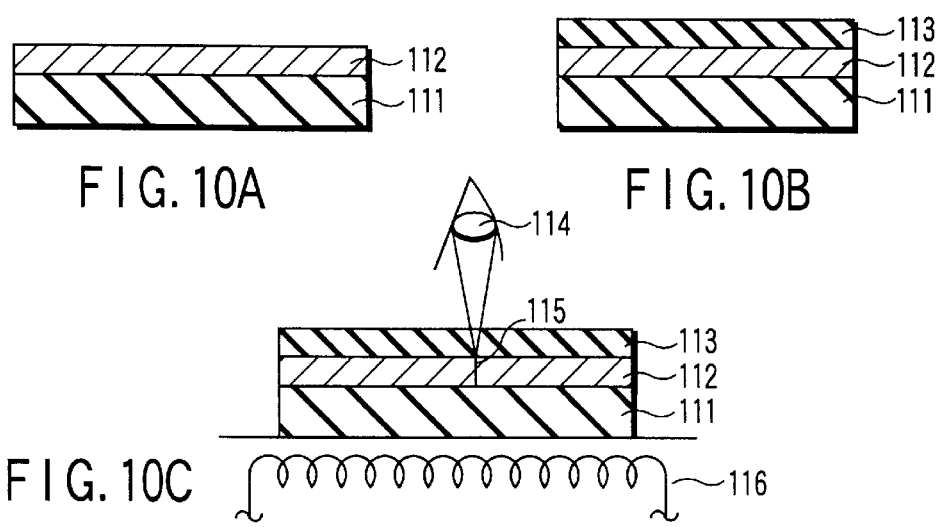
FIG. 10A
FIG. 10B
FIG. 10C
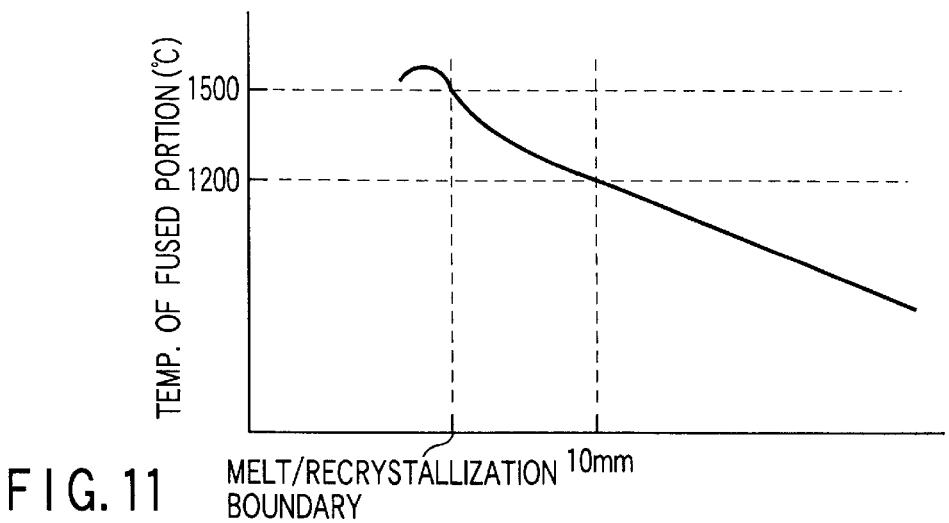
FIG. 11   MELT/RECRYSTALLIZATION BOUNDARY   10mm

METHOD OF FORMING POLYCRYSTALLINE SILICON THIN LAYER

BACKGROUND OF THE INVENTION

1. Field of the Invention

This invention relates to a method of forming a polycrystalline silicon thin layer to be employed as a power generating layer of a solar power generating element, and to a solar power generating element.

2. Description of the Background

A solar cell has been conventionally manufactured by forming a p-n junction by making use of a substrate having a thickness of several hundreds micrometers and consisting of a monocrystalline silicon or a polycrystalline silicon. However, due to a rapid increase in demand for the solar cell nowadays, the supply of silicon crystal substrate is now failing to meet the demand. Therefore, due to this unbalanced relation between supply and demand, there is seen a tendency to raise the price of the substrate. Under such circumstances, it is now difficult to achieve the aim to reduce the cost of solar cell so as to propagate the solar cell.

In view of the circumstances mentioned above, there have been many attempts to deposit a silicon layer on various kinds of substrate by means of plasma spraying. However, since the silicon deposited by means of plasma spraying is considered in any of these attempts as being a substitution for a polycrystalline silicon as represented by a cast silicon, the thickness thereof is as thick as 100 µm or so, so that it is impossible, with these attempts, to solve the shortage in supply of the raw silicon material.

BRIEF SUMMARY OF THE INVENTION

The present invention has been accomplished under the aforementioned circumstances, and therefore, the object of the present invention is to provide a method which enables to form, with a reduced consumption of raw material, a polycrystalline silicon thin layer to be employed as a power generating layer of a solar power generating element for realizing the manufacture of a high efficiency cell at low cost.

Another object of the present invention is to provide a solar power generating element which is high in efficiency and low in manufacturing cost.

Namely, according to this invention, there is provided a method of forming a polycrystalline silicon thin layer, which comprises the steps of; forming a silicon thin film on a surface of a heat resistant substrate by making use of polycrystalline silicon fine particles as a raw material; and heating the silicon thin film thereby to recrystallize the silicon thin film and hence to enlarge an average particle diameter of the polycrystalline silicon fine particles;

wherein the silicon thin film is formed by depositing the polycrystalline silicon fine particles directly on the surface of the substrate, and meets a relationship represented by the following formula (1):

$$W_A/(V_S \cdot d_S) \geq 0.95 \quad (1)$$

wherein $W_A$ is the weight of the polycrystalline silicon fine particles which is actually deposited on the surface of the substrate; $V_S$ is a volume of the silicon thin film which is deposited on the surface of the substrate; and $d_S$ is a density of the silicon.

The heat resistant substrate may be heated during the formation of the silicon thin film by means of a resistance heater or an infrared ray lamp.

According to this invention, there is also provided a method of forming a polycrystalline silicon thin layer, which comprises the steps of; forming a silicon thin film on a surface of a heat resistant substrate by making use of polycrystalline silicon fine particles as a raw material; and heating the silicon thin film thereby to recrystallize the silicon thin film and hence to enlarge an average particle diameter of the polycrystalline silicon fine particles;

wherein the silicon thin film is formed by coating or depositing a mixture containing the polycrystalline silicon fine particles on the surface of the heat resistant substrate, and the mixture is formed of the polycrystalline silicon fine particles and a material selected from the group consisting of a solution of a polysilane derivative in a solvent, a liquid polysilane derivative and a gel-like polysilane derivative.

In this case, the silicon thin film may be flattened by making use of a roller, etc. after the silicon thin film is formed on the heat resistant substrate and prior to the heating step.

Alternatively, the silicon thin film may be formed by a process wherein a molten silicon is poured over the surface of a heated heat resistant substrate and then allowed to solidify.

In this case, the thickness of the molten silicon to be poured over the surface of a heated heat resistant substrate should preferably be not more than 30 µm.

According to this invention, there is further provided a method of forming a polycrystalline silicon thin layer, which comprises the steps of; forming a silicon thin film on a surface of a heat resistant substrate by making use of polycrystalline silicon fine particles as a raw material; and heating the silicon thin film thereby to recrystallize the silicon thin film and hence to enlarge an average particle diameter of the polycrystalline silicon fine particles;

wherein the silicon thin film is formed by depositing the raw polycrystalline silicon fine particles having an average particle diameter ranging from 1 µm to 100 µm directly on the surface of the heat resistant substrate.

More preferably, an average particle diameter of the raw polycrystalline silicon fine particles should be in the range of 1 µm to 30 µm According to the method of this invention, the step of enlarging an average particle diameter of the polycrystalline silicon fine particles may be performed by a process wherein the silicon thin film is heated by the irradiation of a linearly converged beam emitted from a rod-like lamp thereby melting the silicon thin film, a molten portion of which is then solidified through cooling under a suitable condition in terms of time and temperature gradient.

Alternatively, polysilazane may be coated on the surface of the deposited silicon thin film prior to the step of enlarging an average particle diameter of the polycrystalline silicon fine particles, the resultant polysilazane coated film being subsequently heated thus forming a silicon dioxide coating film.

According to this invention, there is further provided a solar power generating element comprising a substrate; and a power generating layer consisting of a polycrystalline silicon thin layer; wherein the substrate is formed of a metal plate and a film of at least one material selected from the group consisting of silicon dioxide, magnesium oxide, zirconia and silicon nitride, the film being formed at least partially on a surface of the metal plate.

The substrate of the solar power generating element according to this invention may be constructed such that a silicon dioxide film and a magnesium oxide film are successively formed at least partially on the surface of the metal plate.

The polycrystalline silicon thin layer constituting the power generating layer may be partially contacted with the surface of the metal plate.

The polycrystalline silicon thin layer should preferably be formed of a boron-doped p-type crystal.

According to this invention, there is further provided an apparatus for melting and depositing silicon, which comprises a plasma generating region into which silicon fine particles as a raw material are sprayed, wherein at least a wall surface portion through which a raw material gas is passed is coated with a graphite or silicon carbide thin film.

The plasma generating region into which the raw silicon fine particles are sprayed should preferably be designed such that the plasma is generated by means of high frequency induction system or microwave.

In the method of forming a polycrystalline silicon thin layer according to this invention, since raw silicon is deposited directly on the surface of a heat resistant substrate thereby to form a thin film, the utilization efficiency of raw material can be markedly improved. For example, if a plasma spraying technique is to be employed in this case, the utilization efficiency of raw material would exceed over 50%, while if a coating method is to be employed in this case, it is possible theoretically to increase the utilization efficiency of raw material up to 100%.

It is possible according to the deposition method of this invention which is high in deposition rate and in raw material utilization efficiency to lower the temperature of substrate during the deposition step. For example, even if a plasma spraying method is employed, an average temperature of the substrate may be as low as around 600° C. for sufficiently carrying out the deposition. Therefore, it is now possible to prominently reduce the diffusion of impurities from the substrate as compared with the conventional method of using CVD.

In the recrystallization of the silicon film deposited on the surface of a substrate, the deposited silicon film is required to be melted. However, if the deposited silicon film is entirely heated, the molten layer may be balled up, thus making it difficult to form a uniform silicon film. On the other hand, if the deposited silicon film is heated using a converged infrared beam emitted from a lamp, it is impossible to effectively heat the silicon film due to the low absorption coefficient of silicon, thus giving rise to the phenomenon that the silicon film cannot be melted if it is thin.

Whereas, according to the method of this invention, since the silicon film is deposited on the surface of a heat resistant substrate, the light can be absorbed by this heat resistant substrate, thus making it possible to easily melt the silicon film even if the silicon film is thin. Rather, since the substrate side becomes higher in temperature, the crystallization is promoted in the direction of deposition, thus making it possible to obtain a columnar crystal. This can be ascribed to the phenomenon that the configuration of the solid-liquid interface at the occasion of solidification takes a state where the liquid layer goes underneath the solid layer, and this phenomenon is retained as it is at the moment of recrystallization.

As explained above, it is possible according to the method of this invention to form a polycrystalline silicon thin layer to be employed as a power generating layer of a solar power generating element with a reduced consumption of raw material.

Therefore, it is now possible, by making use of a solar power generating element of this invention which is provided with the aforementioned polycrystalline silicon thin layer as a power generating layer, to realize a solar cell which is high in efficiency and low in manufacturing cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9A and 9B are cross-sectional views each illustrating a further example of the method of forming a polycrystalline silicon thin layer according to this invention;

FIGS. 10A to 10C are cross-sectional views schematically illustrating the process of recrystallization;

FIG. 11 is a graph illustrating a temperature gradient of a silicon film at the occasion of recrystallization;

DETAILED DESCRIPTION OF THE PREFERRED EMBODIMENTS

This invention will be further explained in detail with reference to the examples.

First of all, by making use of graphite as a heat resistant substrate, while polycrystalline silicon having a purity of 6N as a raw material, the polycrystalline silicon was deposited directly on the surface of the substrate by means of a plasma spraying method, thereby forming a deposition layer. Thereafter, the crystal grain diameter of the polycrystalline silicon was enlarged by means of a melting recrystallization method thereby to form a polycrystalline silicon thin layer.

Figure 1:
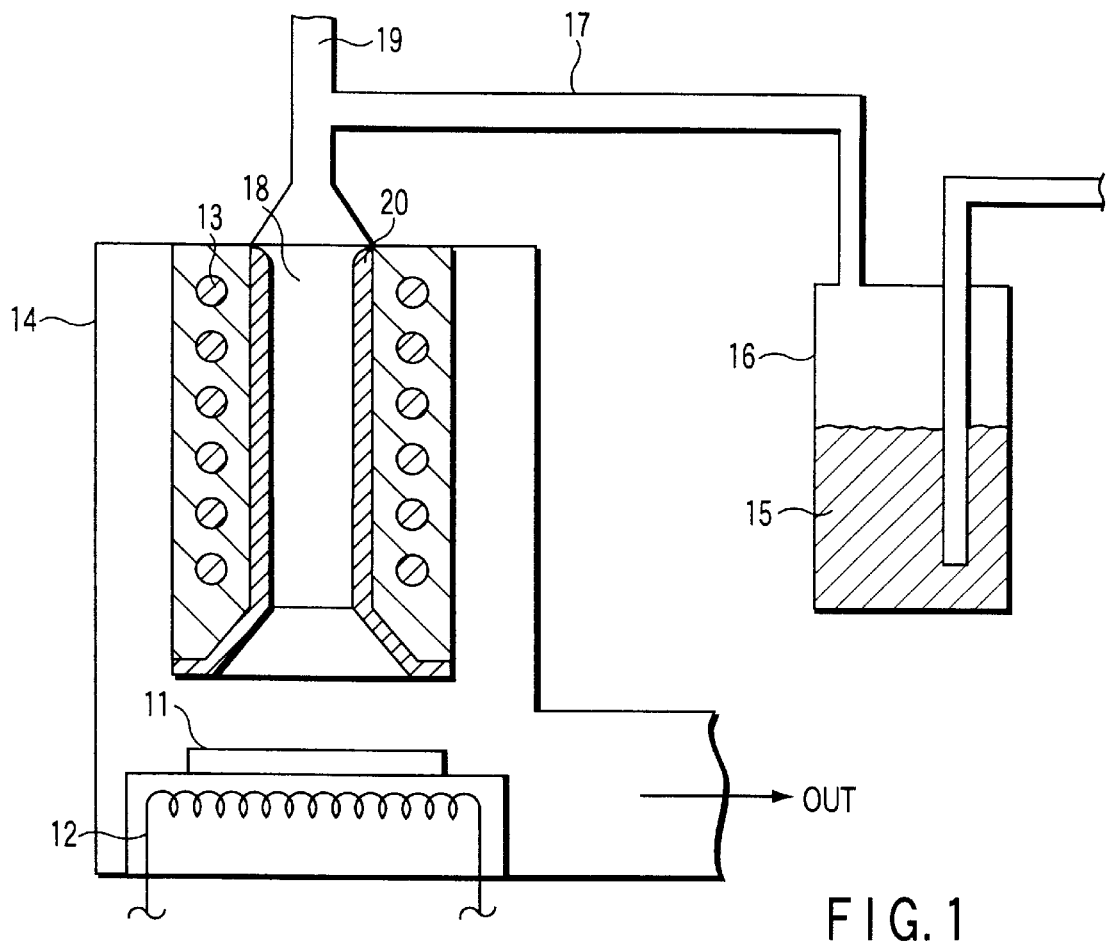
FIG. 1 is a diagram schematically illustrating one example of a silicon thin film deposition apparatus.

FIG. 1 shows a diagram schematically illustrating one example of a silicon melt-deposition apparatus. Referring to FIG. 1, a silicon raw material powder 15 which has been placed in a raw material vessel 16 is fed together with Ar gas functioning as a carrier gas to a plasma-generating region 18 formed inside the a growth chamber 14 via a raw material feeding pipe 17. If required, an inert gas may be fed to the plasma-generating region 18 so as to dilute the gaseous atmosphere. Further, hydrogen gas may also be fed to the plasma-generating region 18.

By the way, as shown in FIG. 1, at least the side wall portion of the plasma-generating region 18 through which the raw material gas passes should preferably be lined with an inner coating layer 20 consisting of a graphite or silicon carbide thin film. The details of this inner coating will be explained hereinafter.

A plasma-generating gas is introduced into the plasma-generating region 18 from a plasma-generating gas inlet pipe 19, and a plasma is caused to generate by the effect of high frequency generated from an RF coil 13. The silicon raw material powder 15 being fed is caused to liquefy or vaporize depending on the magnitude of input power as the silicon raw material powder 15 passes through the plasma-generating region. When the silicon raw material powder is liquefied, the silicon raw material powder is allowed to reach the surface of a substrate 11 while the liquid state of silicon raw material is kept maintained. Upon being contacted with the surface of a substrate 11, the liquid silicon raw material is cooled and solidified. On the other hand, when the silicon raw material powder is vaporized, the silicon raw material vapor is caused to liquefy after the silicon raw material vapor is moved from the downstream of the plasma region and before the silicon raw material vapor reaches the surface of the substrate 11. Upon being contacted with the surface of a substrate 11, the liquid silicon raw material is solidified.

In this manner, the silicon is allowed to deposit on the surface of a substrate 11 at a high deposition rate of 10 μm/min. or more.

The silicon layer thus deposited on the substrate in this manner is somewhat porous, and the crystal grain diameter thereof is as small as several micrometers at most. Therefore, the deposited silicon layer is not yet provided with a sufficient property for use as a power generating layer. Accordingly, it is designed, according to the method of this invention, to heat the deposited silicon layer so as to melt it and then to recrystallize the silicon layer. As a result of this treatment, the density of the deposited silicon layer can be improved and at the same time, the grain diameter of the silicon crystal can be enlarged.

The magnitude of the enlargement of crystal grain varies depending partially on the thickness of the deposited layer. For example, when an Si deposition layer having a thickness of 20 μm is melted and recrystallized, the average crystal grain diameter can be enlarged up to about 200 μm. If the crystal grain diameter is several micrometers or so, the life of minority carrier cannot be prolonged to 1 microsecond even if the crystal is of high purity. Whereas, if the crystal grain diameter is more than 100 μm, it is possible to prolong the life of minority carrier up to several tens microseconds or more than 100 μsec.

In this case, if the deposited layer is too large in thickness, it is not only impossible to increase the recrystallization rate, but also difficult to avoid the generation of temperature distribution in the direction of deposition (thickness) thereby to generate the grain boundary in the direction of deposition, thus possibly inviting a cause for lowering the mobility of minority carrier.

With a view to investigate the influence of the magnitude in thickness of the deposited layer, various kinds of polycrystalline silicon layer each differing in thickness were formed according to the method of this invention. Then, by making use of an electron microscope, the crystal structures of these polycrystalline silicon layers were observed to see if the crystal structure thereof was of columnar structure. Further, various kinds of solar cells were prepared by making use of these polycrystalline silicon layers as a power generating layer, and the power generation 1 it efficiency thereof was measured. The results obtained are summarized in the following Table 1.

TABLE 1

| Thickness of deposition (μm) | 0.3 | 0.5 | 1.0 | 3.0 | 5.0 | 10.0 | 30.0 | 50.0 | 100.0 |
|---|---|---|---|---|---|---|---|---|---|
| power generating efficiency | 1 | 3 | 7 | 12 | 12.2 | 12.5 | 13 | 10 | 10 |
| Columnar structure | ○ | ○ | ○ | ○ | ○ | ○ | ○ | X | X |

In Table 1, "○" indicates a result where the columnar structure was recognized, while "X" indicates a result where the columnar structure was not recognized.

By providing a deposited silicon layer with a suitable surface texture structure, it is possible, even if the thickness of the deposited silicon layer is 10 μm, to realize a solar cell having a power generating efficiency which is almost equivalent to that of a bulk polycrystalline silicon solar cell having a thickness of 300 μm. However, with a decrease in thickness of the deposited silicon layer, the power generating efficiency of the cell was also proportionally lowered. Thus, when the thickness of the deposited silicon layer is less than 3 μm, the power generating efficiency was sharply lowered. This phenomenon can be ascribed partially to the influence of recombination at the interface which relatively increases with a decrease in thickness of the deposited silicon layer, and partially to the high concentration of carrier trap level due to the diffusion of impurities from the substrate.

When the crystal texture of the deposited silicon layer was observed, the so-called columnar structure which was free from crystal boundary in the deposition direction was recognized to be obtained by the recrystallization of deposited silicon layer having a thickness of not more than 30 μm. Whereas, when the thickness of the deposited silicon layer was larger than 30 μm, the generation of temperature distribution in the deposition direction was recognized, and, due to this temperature distribution, the crystal nucleus was generated irregularly at the occasion of the recrystallization. As a result, the grain boundary in the deposition direction was generated. When the deposited silicon layer was smaller in thickness, it was possible to increase the recrystallization speed. Whereas, the larger the thickness of the deposited silicon layer was, the more time it required to accomplish the recrystallization.

Therefore, in view of the power generating efficiency and the crystal structure of the deposited silicon layer, the film thickness of silicon to be deposited on the surface of the substrate is limited to the range of from 3 to 30 μm in this invention. By the way, more preferable range of the film thickness of silicon to be deposited is 5 to 20 μm.

The following phenomena have been found out by the present inventors as a result of intensive study on the deposition layer formed by means of the melt-deposition method. Namely, since silicon particles are once fused in the vapor phase according to the melt-deposition method, the silicon is more likely to be oxidized due to the strong influence of oxygen. As a result, oxygen is entrapped in the deposited silicon film, thus leading to a deterioration of the life of minority carrier in the power generating layer.

With a view to minimize the influence of oxygen, silicon films were formed by means of the melt-deposition method while changing the pressure of Ar atmosphere, and then, the oxygen concentration in the deposited silicon film and the life of p-type Si minority carrier were investigated. The results are shown in FIG. 2.

Figure 2:
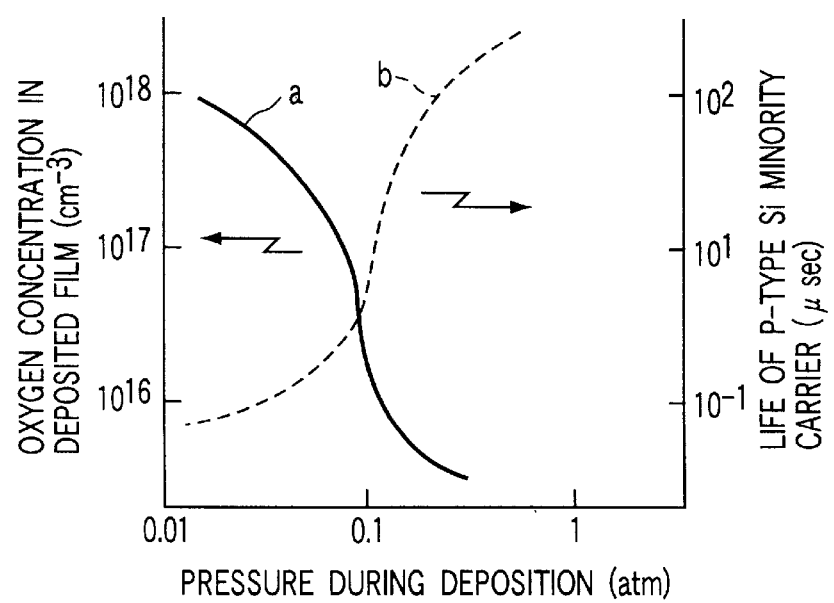
FIG. 2 is a graph illustrating the relationship between the pressure at the occasion of depositing an Si thin film and the concentration of oxygen in the deposited film, and the relationship between the pressure at the occasion of depositing an Si thin film and the life of p-type Si minority carrier in the deposited film.

In FIG. 2, the curve "a" indicates the oxygen concentration in the deposited silicon film, and the curve "b" indicates the life of p-type Si minority carrier. As seen from the graph of FIG. 2, when silicon was deposited in an Ar atmosphere, the quantity of oxygen trapped in the deposited silicon film decreased with an increase in pressure. This indicates that the quantity of oxygen to be trapped in the deposited silicon film from the oxide layer of the surface of raw material powder as well as from the ambient atmosphere of the apparatus becomes larger at a lower the pressure. Further, when hydrogen gas is mixed in advance into the deposition atmosphere, the minority carrier life time can be improved.

This effect of hydrogen can be explained as follows. Namely, when the hydrogen in an atmosphere containing hydrogen gas is trapped in the deposited silicon film, the dangling bond of crystal defects (such as crystal boundary, dislocation, etc.) is terminated by the hydrogen. Once the dangling bond is terminated by hydrogen, the crystal defects are inactivated as a carrier scattering center.

Therefore, it is preferable, at the occasion of forming a polycrystalline silicon thin layer on the surface of a heat resistant substrate, to deposit silicon directly on the surface of a heat resistant substrate at a pressure of 0.1 atm or more of an atmosphere containing an inert gas or hydrogen gas.

Figure 3:
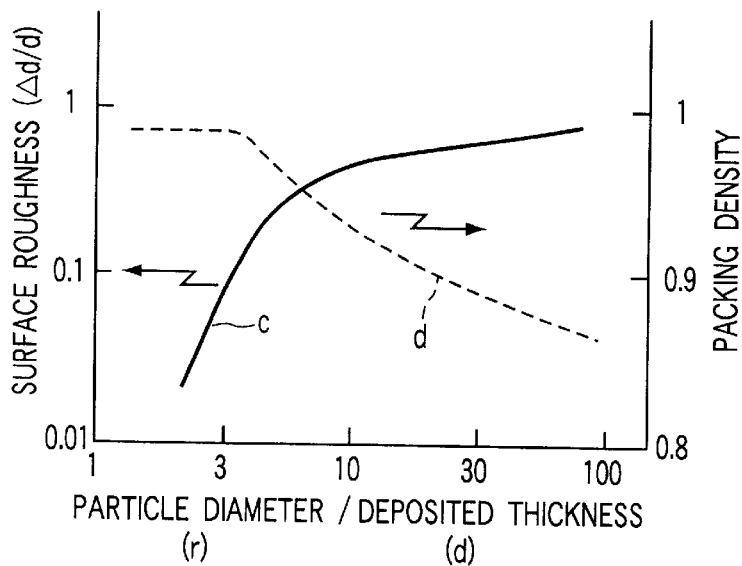
FIG. 3 is a graph illustrating the relationship between the particle diameter of particulate raw material and the surface roughness of the deposited layer, and the relationship between the particle diameter of particulate raw material and the packing density of the deposited layer.

FIG. 3 illustrates the influence of the average particle diameter (r) of raw silicon powder to be employed in the deposition of silicon on the surface roughness of the deposited film and on the packing density of silicon. The curve "c" in FIG. 3 denotes the surface roughness of the deposited silicon film, while the curve "d" in FIG. 3 denotes the packing density of silicon.

As shown in FIG. 3, as the ratio (r/d) between the particle diameter (r) of the raw silicon powder and the thickness (d) of the deposited silicon film became larger, the surface roughness (Δd/d) of the deposited film was reduced while the packing density of silicon was increased. For example, if a silicon raw material having a particle diameter of more than 100 μm is employed for the purpose of obtaining a silicon deposition film having a thickness of 30 μm, the surface roughness of the resultant deposition film would be sharply increased. In addition to that, the packing density of the resultant deposition film would become lower than the value of 95% which is required for the recrystallization of the silicon deposition film. Almost the same phenomenon as mentioned above can be recognized in the case of obtaining a silicon deposition film having a thickness of 3 μm, i.e. when a silicon raw material having a particle diameter of 10 μm is employed for obtaining a silicon deposition film having a thickness of 3 μm, it would result in the deterioration of surface roughness and packing density of the deposition film.

Accordingly, the particle diameter (r) of the raw silicon fine particles should preferably be not more than 3 times the thickness (d) of the deposited silicon film. Further, due to the reasons as explained above, the particle diameter of the raw silicon fine particles should preferably be in the range of 1 to 100 μm, more preferably in the range of 1 to 30 μm. Namely, it is desired to select the particle diameter of the raw silicon fine particles and the thickness of silicon deposition layer so as to meet the aforementioned two conditions.

Figures 4A, 4B:
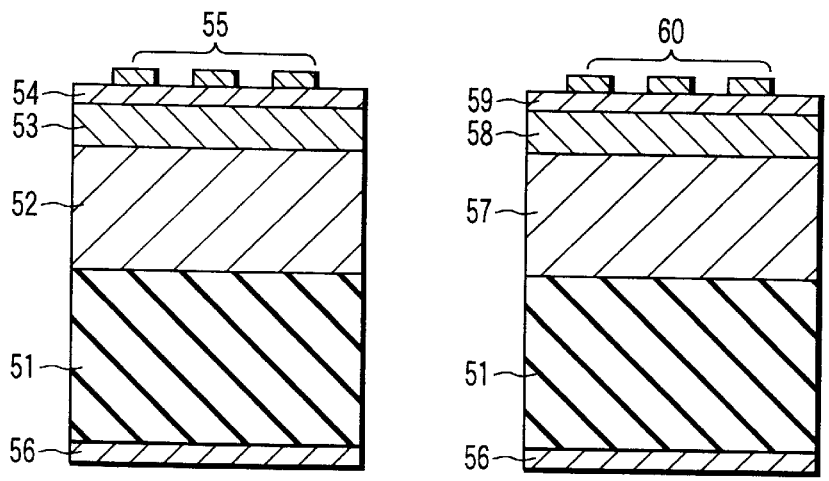
FIGS. 4A and 4B are cross-sectional views each illustrating one example of the solar power generating element of this invention.

FIGS. 4A and 4B show cross-sectional views each schematically illustrating one example of the solar power generating element of this invention.

Specifically, FIG. 4A illustrates one example of the solar power generating element where p-type deposition layer was employed. On the other hand, FIG. 4B illustrates one example of the solar power generating element where n-type deposition layer was employed. It is possible with these two examples to compare the deposition layer consisting of p-type silicon where boron (B) is added as an impurity with the deposition layer consisting of n-type silicon where phosphorus (P) is added as an impurity.

In the case of the solar power generating element shown in FIG. 4A, a p-type silicon (Si:B) deposition layer 52, an n-type silicon (Si:P) layer 53 and a ZnO layer 54 are successively formed on the surface of a substrate 51. Further, a collector electrode 55 is formed on the ZnO layer 54, and a substrate electrode 56 is formed on the bottom surface of the substrate 51.

On the other hand, in the case of the solar power generating element shown in FIG. 4B, an n-type silicon (Si:P) deposition layer 57, a p-type silicon (Si:B) layer 58 and an ITO layer 59 are successively formed on the surface of a substrate 51. Further, a collector electrode 60 is formed on the ITO layer 59, and a substrate electrode 56 is formed on the bottom surface of the substrate 51.

Since the solar cell is designed to collect the minority carrier at the electrode by the effect of inner electric field, the diffusion length or life time of the minority carrier is required to be sufficiently long. The solar cell according to this invention is designed such that the silicon deposition layer is employed as a light absorption layer, while other conductive layers are formed by means of diffusion, etc. so as to make them thinner in thickness. Therefore, the diffusion length of the minority carrier in the silicon deposition layer is required to be large. Since the electron diffusion length in a p-type layer can be made larger than the hole diffusion length in an n-type layer, it is advisable to make the silicon deposition layer into p-type.

Furthermore, it is also advantageous in terms of device property to construct the surface conductive layer in such a manner that an impurity is added at a high concentration in the vicinity of the electrodes of the surface conductive layer. Specifically, although it may depend on the specific structure of device and on the resistance of the surface conductive layer, it is desired that an impurity is added at a concentration of $10^{18}$ cm$^{-3}$ or more in the vicinity of the electrodes of the surface conductive layer. Therefore, it is advantageous to add phosphorus which is capable of being added at a high concentration to the surface conductive layer.

In view of these facts, the structure shown in FIG. 4A where the p-type silicon deposition layer 52 is deposited on the surface of substrate 51 is more advantageous. Additionally, the impurity to be added to the n-type silicon layer 53 constituting the surface conductive layer should more preferably be phosphorus.

It has been found out by the present inventors that when silicon is to be deposited by means of the melt-deposition method employing plasma, the characteristics of deposited film vary depending on the method of generating the plasma. Namely, silicon thin films were formed by means of the melt-deposition method and by employing various kinds of plasma-generating method, i.e. DC plasma, RF plasma and microwave plasma. The species of impurity, the concentration of impurity and the raw material utilization efficiency in each of the deposited films were investigated to obtain the results shown in the following Table 2.

TABLE 2

| Plasma-generating method | DC | RF | μ-wave |
|---|---|---|---|
| Impurity species | W, Fe, Cu | 0 | 0 |
| Impurity concentration | 70 ppm | <1 ppm | <1 ppm |
| Raw material utilization efficiency | 20–40% | 50–80% | 40–70% |

As shown in Table 2, in the experiments where RF plasma or microwave plasma was employed, the species 5 of impurity were not detected. However, in the experiments where DC plasma was employed, various kinds of impurity such as W, Fe and Cu were detected. The reason for this phenomenon is assumed to be attributed to the fact that the electrode functioning as a plasma generating source was exposed in the deposition apparatus. For example, when these plasma generating methods were compared with respect to the total quantity of metallic impurities in the deposited film under the condition of 5 μm/min in deposition rate, substantially no metallic impurities could be detected in the cases where RF plasma or microwave plasma was employed, whereas Fe and W in quantity of the order of ppm level were detected in the case where DC plasma was employed. Since transition metals were known to become a carrier killer in a silicon layer, the employment of DC plasma is disadvantageous in this respect.

By the way, when DC plasma is employed, the velocity of the fused droplet is relatively high, so that even though the adhesivity of the deposited film to the substrate may be enhanced as compared with that formed according to other methods, the quantity of raw material to be repelled from the substrate would be increased. Therefore, the employment of DC plasma is much disadvantageous in terms of the utilization efficiency of raw material. Since the adhesion between the substrate and a deposited silicon film can be enhanced in the process of recrystallization after the deposition of the film, the employment of RF or microwave as a plasma generating source is more preferable in view of the prevention of intermixing of impurities and the enhancement of raw material utilization efficiency.

As explained above, even though the deposited silicon film by means of plasma melt-deposition method employing RF or microwave may be insufficient in adhesivity to the substrate, this problem can be overcome by the heat treatment of the substrate.

Figure 5:
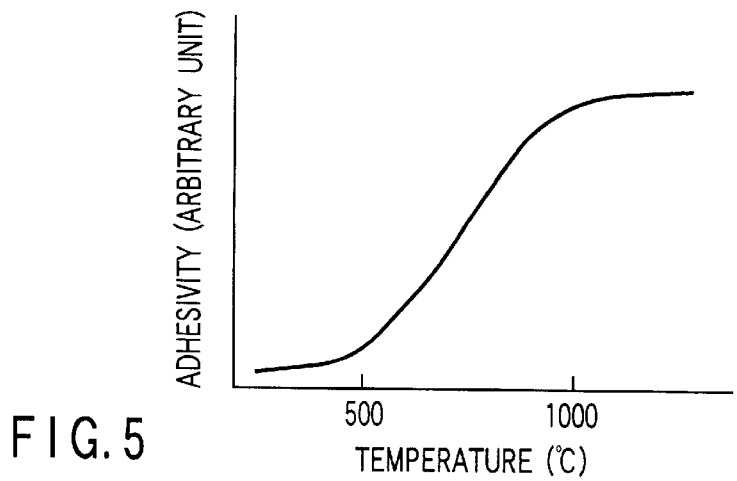
FIG. 5 is a graph illustrating the relationship between the heating temperature of the substrate and the adhesivity of the deposited film to the substrate.

FIG. 5 shows the relationship between the heating temperature of the substrate and the adhesivity of the deposited silicon film. As seen from this graph, when the temperature of substrate is increased higher than 500° C., the adhesivity of the deposited silicon film can be enhanced. In particular, the adhesivity of the deposited silicon film improves in proportion to an increase in temperature of the substrate until the heating temperature reaches to 1,000° C., after which the improvement of adhesivity tends to level off.

It is desirable at the occasion of heating the substrate to avoid the exposure of the heating source to the atmosphere inside the apparatus. Therefore, the employment of a lamp such as an infrared radiation lamp, or of buried type heater such as resistance heater is preferable as a heating means.

By the way, the inner coating layer 20 formed in the silicon melt-deposition apparatus shown in FIG. 1 is applied with a view to prevent impurities from generating out of the side wall portion of the plasma-generating region 18 where the silicon fine particles are sprayed and through which the raw material gas passes. The power generating efficiency of silicon solar cell would be extremely deteriorated if it is contaminated with impurities. Therefore, if it is desired to realize 10% or more of cell power generating efficiency, the concentration of transition metal as an impurity should preferably be limited to about 1 ppm or less.

If the side wall of the plasma generating region 18 is constituted by a ceramic such as mullite in the construction of silicon melt-deposition apparatus shown in FIG. 1, there is a possibility that the constituent materials of the side wall per se or the elements contained in the constituent materials may be released due to the sputtering effect of plasma and entrapped as impurities in a silicon crystal to be deposited. For example, when the deposition of a silicon layer was carried out by making use of an apparatus which was provided with a mullite tube as the side wall without employing a coating layer 20, the inclusion of 300 ppm of Al and 10 ppm of Zr as impurities in the resultant silicon layer was confirmed through elemental analysis. In this case, since a p-type silicon layer functioning as a light absorption layer was suffered from the limitation due to the Al concentration, the carrier concentration would become $10^{18}$ cm$^{-3}$ or more. Moreover, since Zr acts as a carrier killer, the cell power generating efficiency would be at most 5% or so.

Whereas, when the deposition of a silicon layer is carried out by making use of an apparatus which is provided with a coating layer 20 consisting of SiC, it is possible to control the concentration of both Al and Zr to 1 ppm of less. The cell power generating efficiency in this case would be increased up to 11%.

It has been found out that the material for the coating layer 20 to be applied to the side wall of the plasma generating region is not restricted to SiC, but C is also effective in obtaining substantially the same effect as in the case of SiC.

As explained above, it is preferable, in the deposition of a polycrystalline silicon thin layer according to method of this invention, to employ a silicon melt-deposition apparatus wherein at least the side wall portion of the plasma-generating region through which a raw material gas passes is lined with a coating layer consisting of a carbon or silicon carbide thin film.

Figure 6:
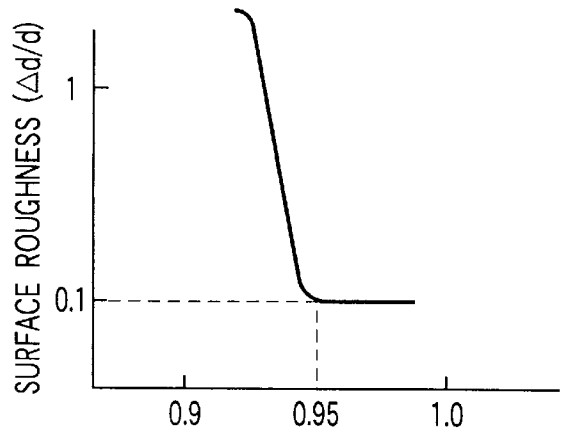
FIG. 6 is a graph illustrating the relationship between the packing density of the deposited film and the surface roughness of the deposited film after the recrystallization thereof.

FIG. 6 shows the relationship between the packing density of the deposited film and the surface roughness of the deposited film after the recrystallization thereof. It should be noted that the term "packing density" in this case means a value ($W_A/(V_S \cdot d_S)$) to be obtained by dividing the weight ($W_A$) of silicon fine particles that has been actually deposited on the surface of substrate by the weight ($W_B$) represented by the product of the volume ($V_S$) of the silicon layer deposited on the surface of substrate and the density ($d_S$) of silicon (Si). The density of silicon is 2.33 g/cm³ at 25° C. On the other hand, the "surface roughness" means a value ($\Delta d/d$) to be obtained by dividing the value of a difference in film thickness ($\Delta d$) by the value of a deposited film thickness (d).

In the case of a deposition film where the packing density is low, a phenomenon of bumping may be caused to happen due to the evaporation of SiO at the voids inside the deposited layer at the occasion of recrystallization, thereby generating a crater-like defect on the surface of the deposited layer. The density of this defect increases with a decrease of the packing density, thus roughening the surface of the deposited layer and also leading to a cause for a short-circuit as it is fabricated into a device. Therefore, the surface roughness ($\Delta d/d$) should preferably be limited to not more than 1 in order to avoid these inconveniences.

As seen from the graph shown in FIG. 6, if the packing density of 95% or more is ensured, the surface roughness of the aforementioned magnitude can be obtained, so that it is possible to prevent the roughening of the recrystallized surface and also to prevent the short-circuit of the device.

Although the method of forming a polycrystalline silicon thin layer according to this invention is featured in that polycrystalline silicon fine particles are deposited directly on the surface of a heat resistant substrate thereby to form a thin film having a predetermined thickness, this method of forming a thin film may be altered as follows.

The polycrystalline silicon fine particles to be employed as a raw material may be deposited as they are, i.e. in the solid state thereof on the surface of a heat resistant substrate. In this case, polysilane is employed as a binder. The polysilane to be employed in this case a compound having an Si skeleton to which an organic compound or a halide is attached as a side chain. An example of a skeleton structure of polysilane is represented by following structural formula.

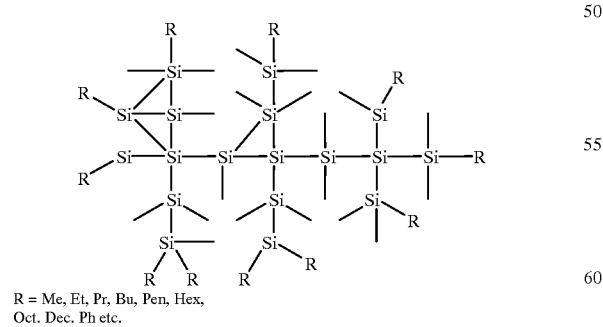

R = Me, Et, Pr, Bu, Pen, Hex, Oct. Dec. Ph etc.

Specific examples of polysilane are represented following general formulas [1-1] to [1-114]. "m" and "n" in following general formulas are integer.

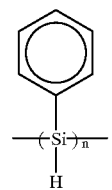
[1-1]

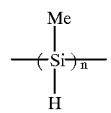
[1-2]

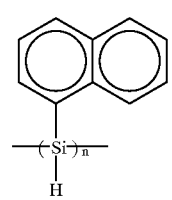
[1-3]

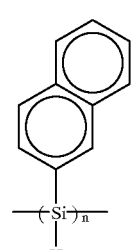
[1-4]

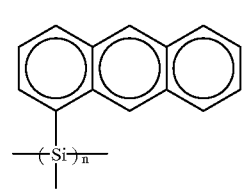
[1-5]

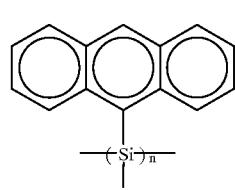
[1-6]

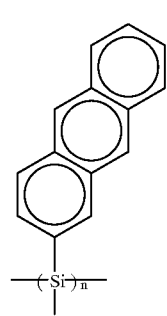
[1-7]

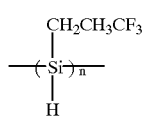 [1-8]
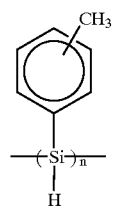 [1-9]
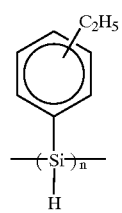 [1-10]
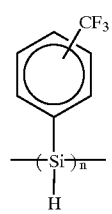 [1-11]
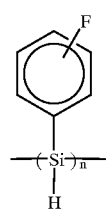 [1-12]
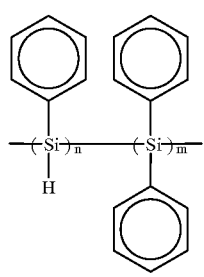 [1-13]
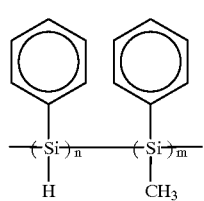 [1-14]
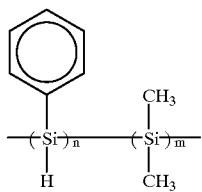 [1-15]
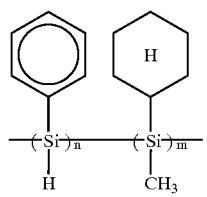 [1-16]
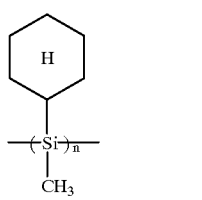 [1-17]
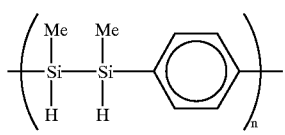 [1-18]
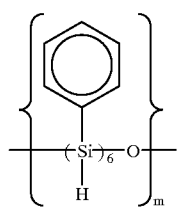 [1-19]
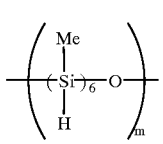 [1-20]
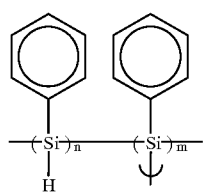 [1-21]
 [1-22]

[1-23] 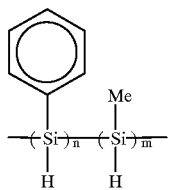
[1-24] 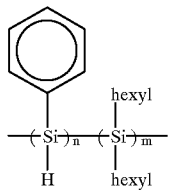
[1-25] 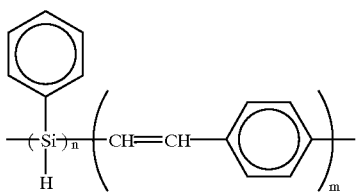
[1-26] 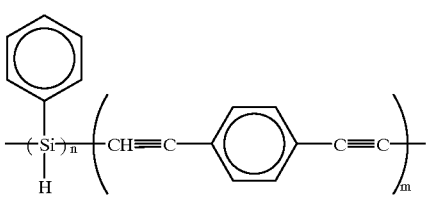
[1-27] 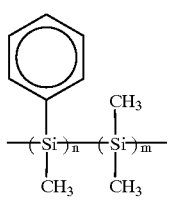
[1-28] 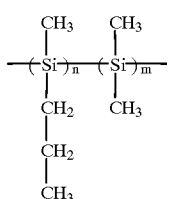
[1-29] 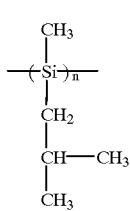
[1-30] 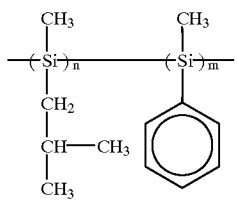
[1-31] 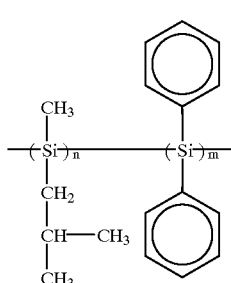
[1-32] 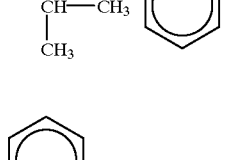
[1-33] 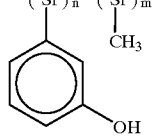
[1-34] 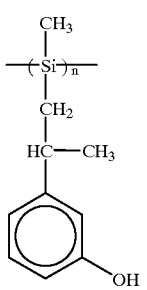

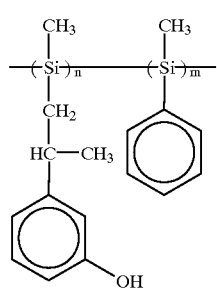 [1-35]
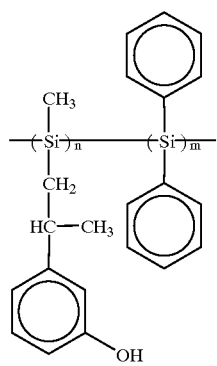 [1-36]
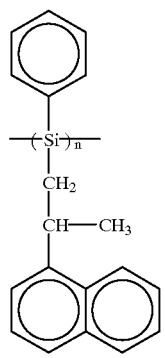 [1-37]
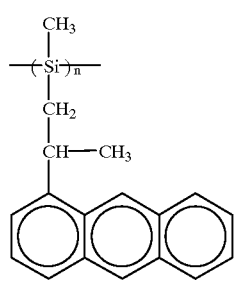 [1-38]
 [1-39]
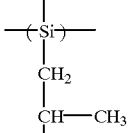 [1-40]
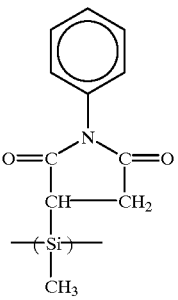 [1-41]
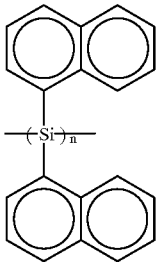 [1-42]
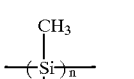 [1-43]
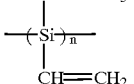 [1-44]
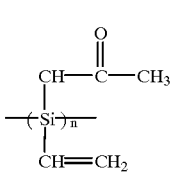 [1-45]

[1-46]
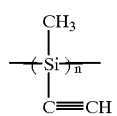
[1-47]
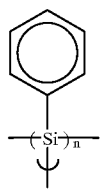
[1-48]
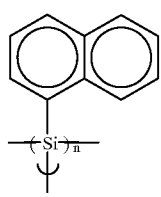
[1-49]
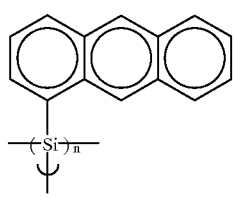
[1-50]
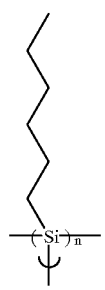
[1-51]
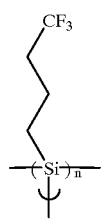
[1-52]
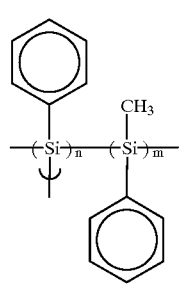
[1-53]
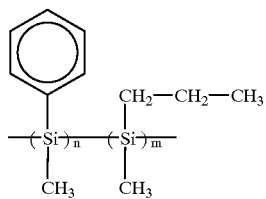
[1-54]
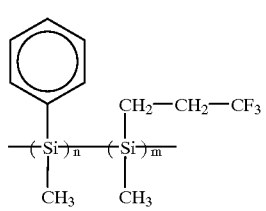
[1-55]
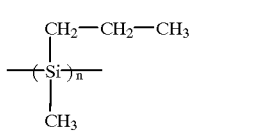
[1-56]
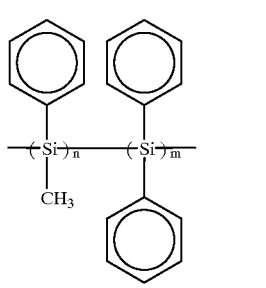
[1-57]
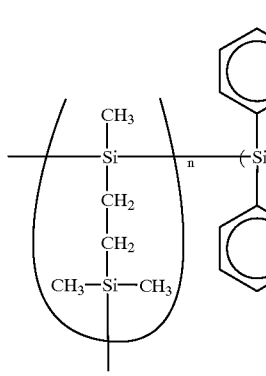
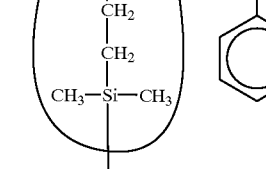

[1-58]
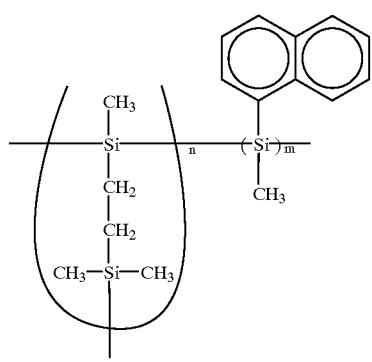
[1-59]
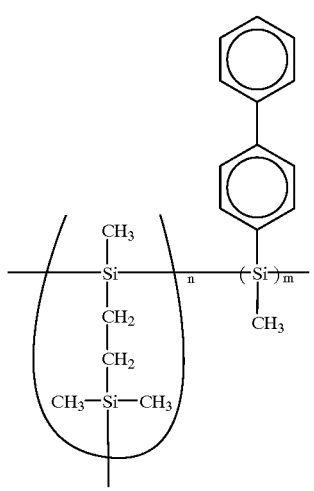
[1-60]
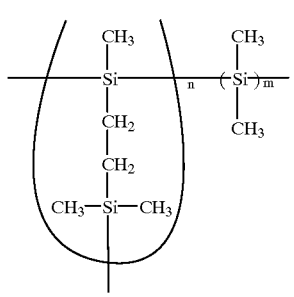
[1-61]
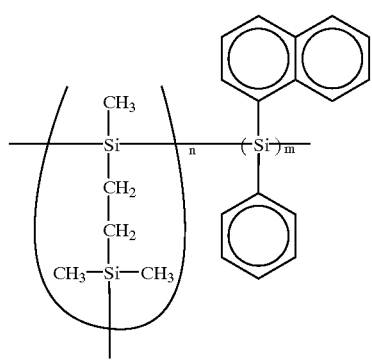
[1-62]
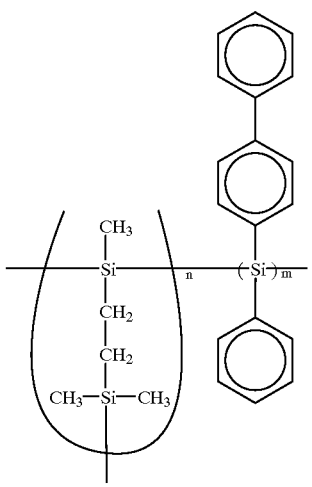
[1-63]
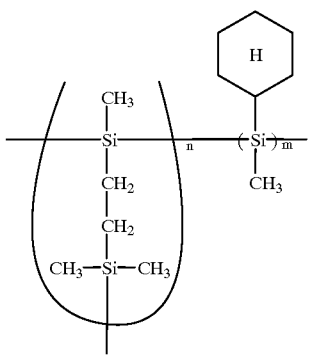
[1-64]
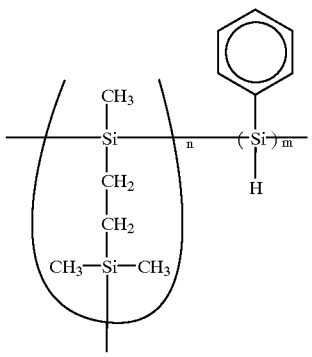

[1-65]
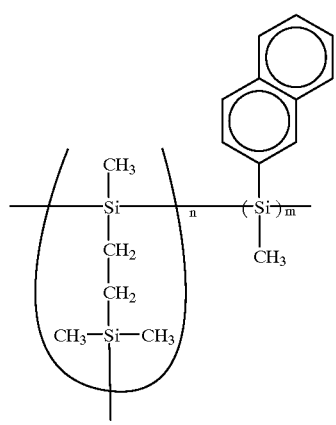
[1-66]
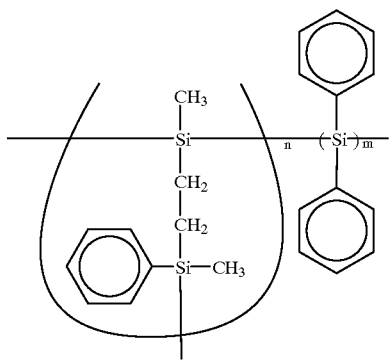
[1-67]
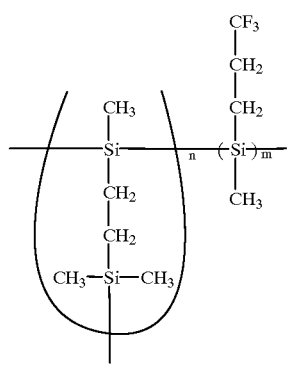
[1-68]
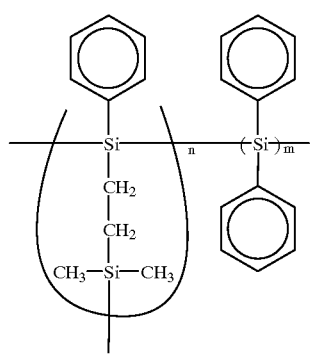
[1-69]
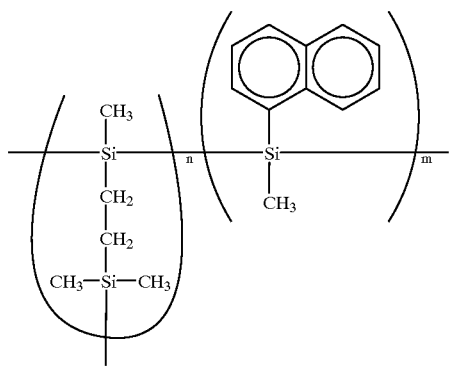
[1-70]
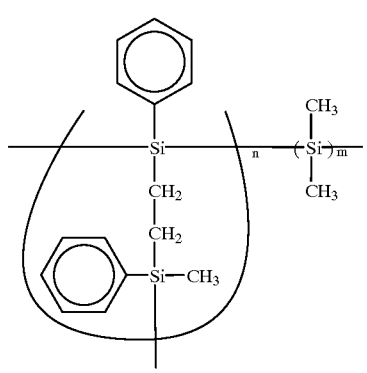
[1-71]
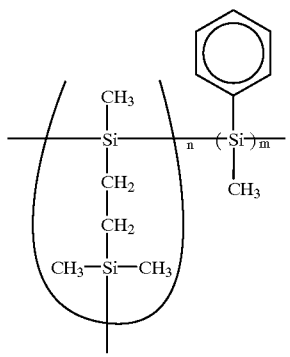
[1-72]
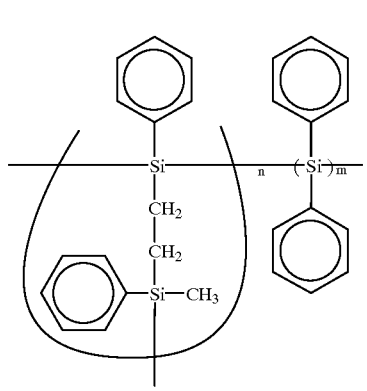

[1-73]
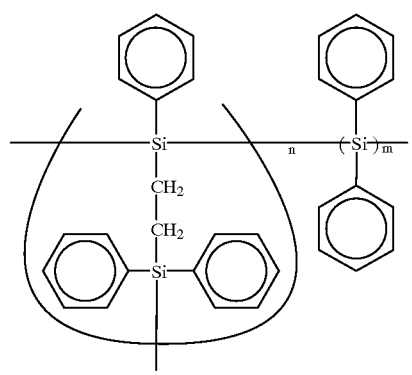
[1-77]
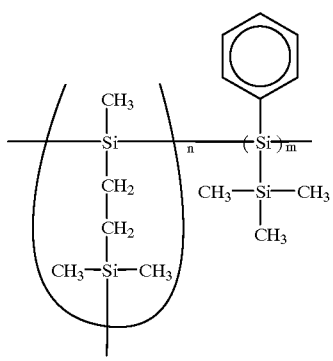
[1-74]
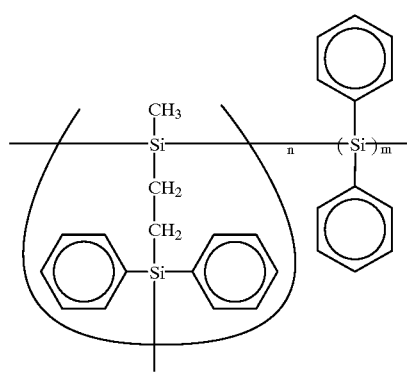
[1-78]
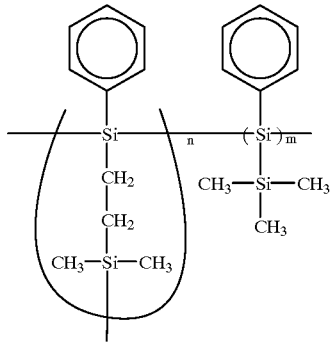
[1-75]
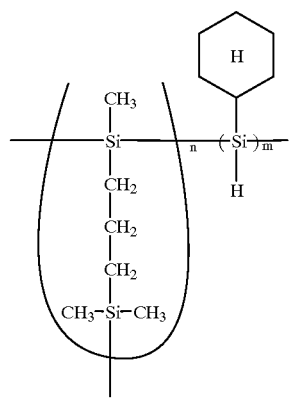
[1-79]
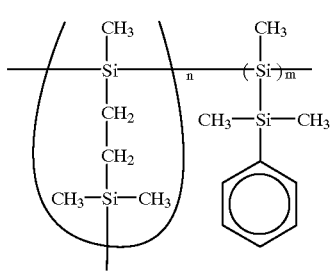
[1-76]
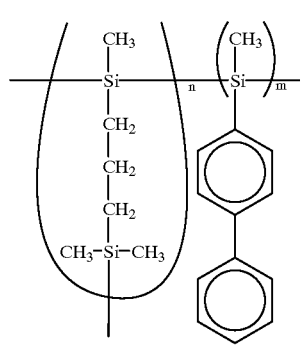
[1-80]
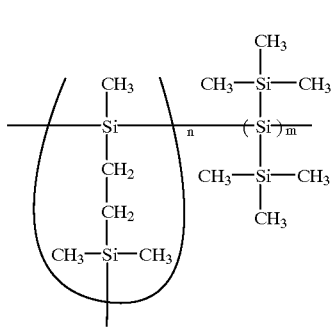

[1-81]
[1-82]
[1-83]
[1-84]
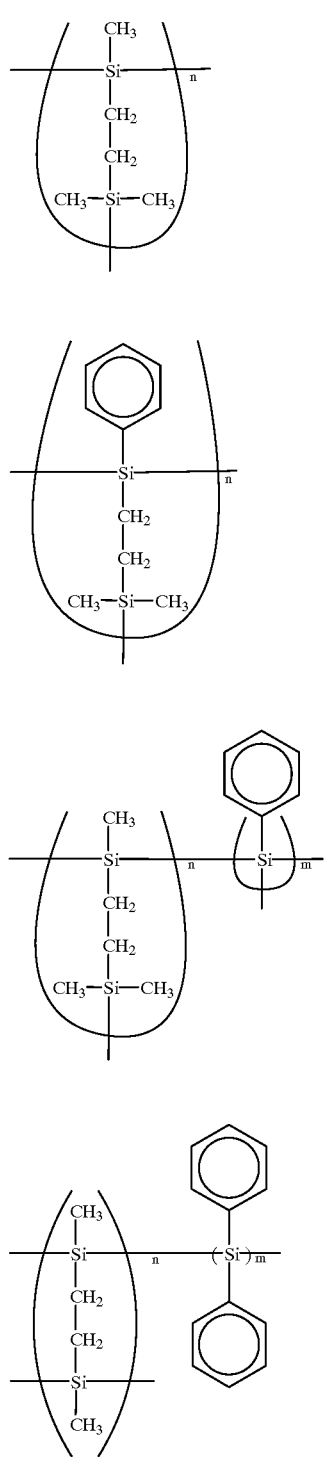
[1-85]
[1-86]
[1-87]
[1-88]
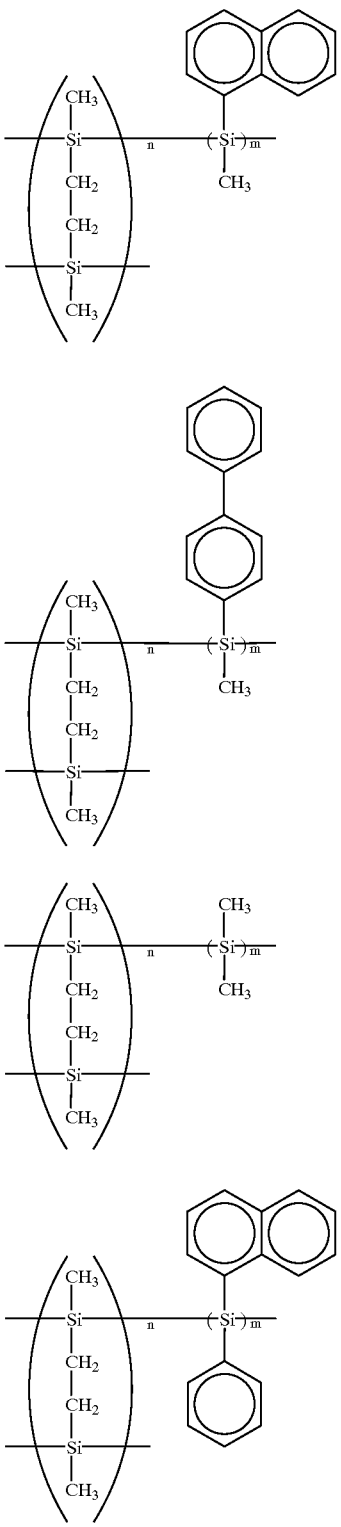

[1-89]
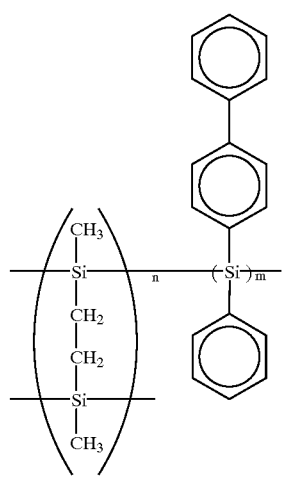
[1-90]
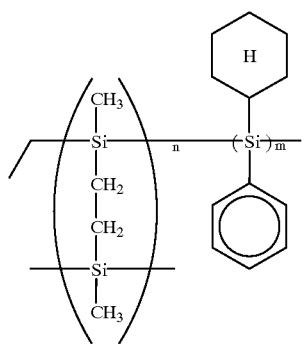
[1-91]
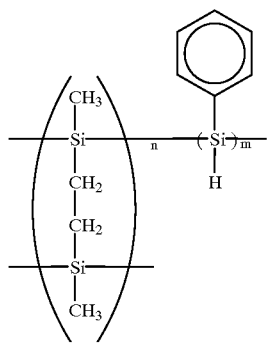
[1-92]
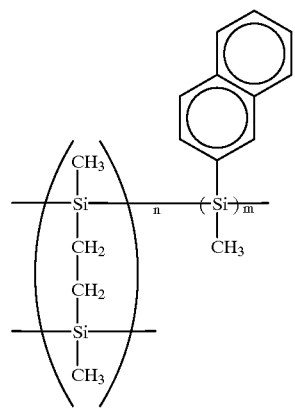
[1-93]
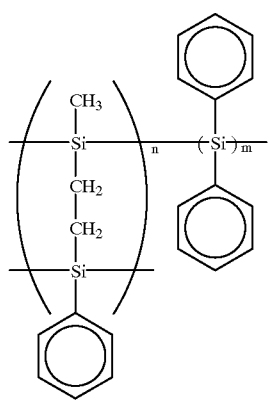
[1-94]
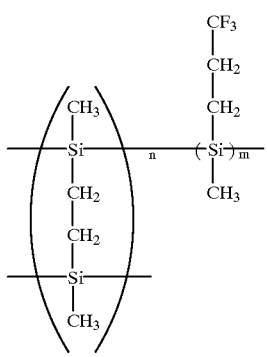
[1-95]
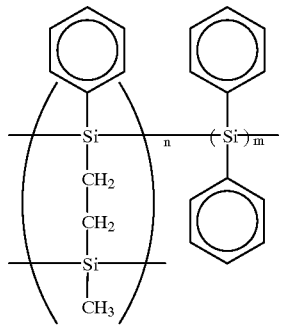
[1-96]
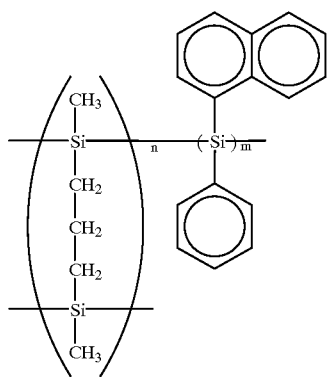

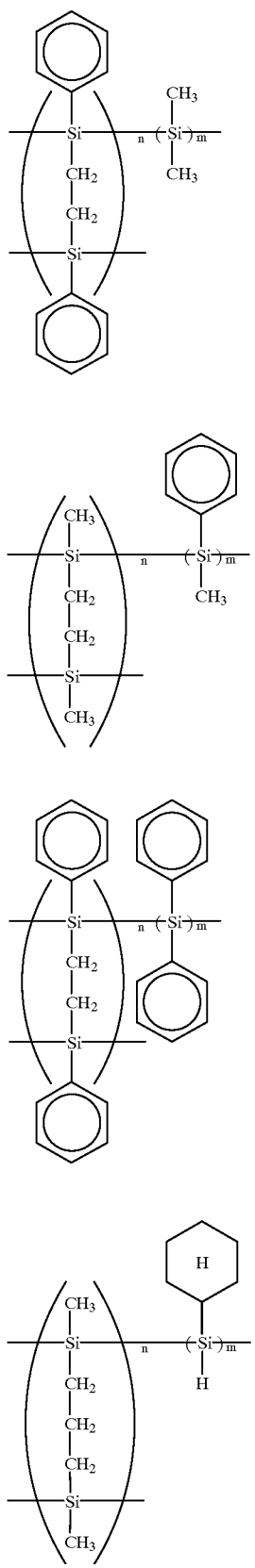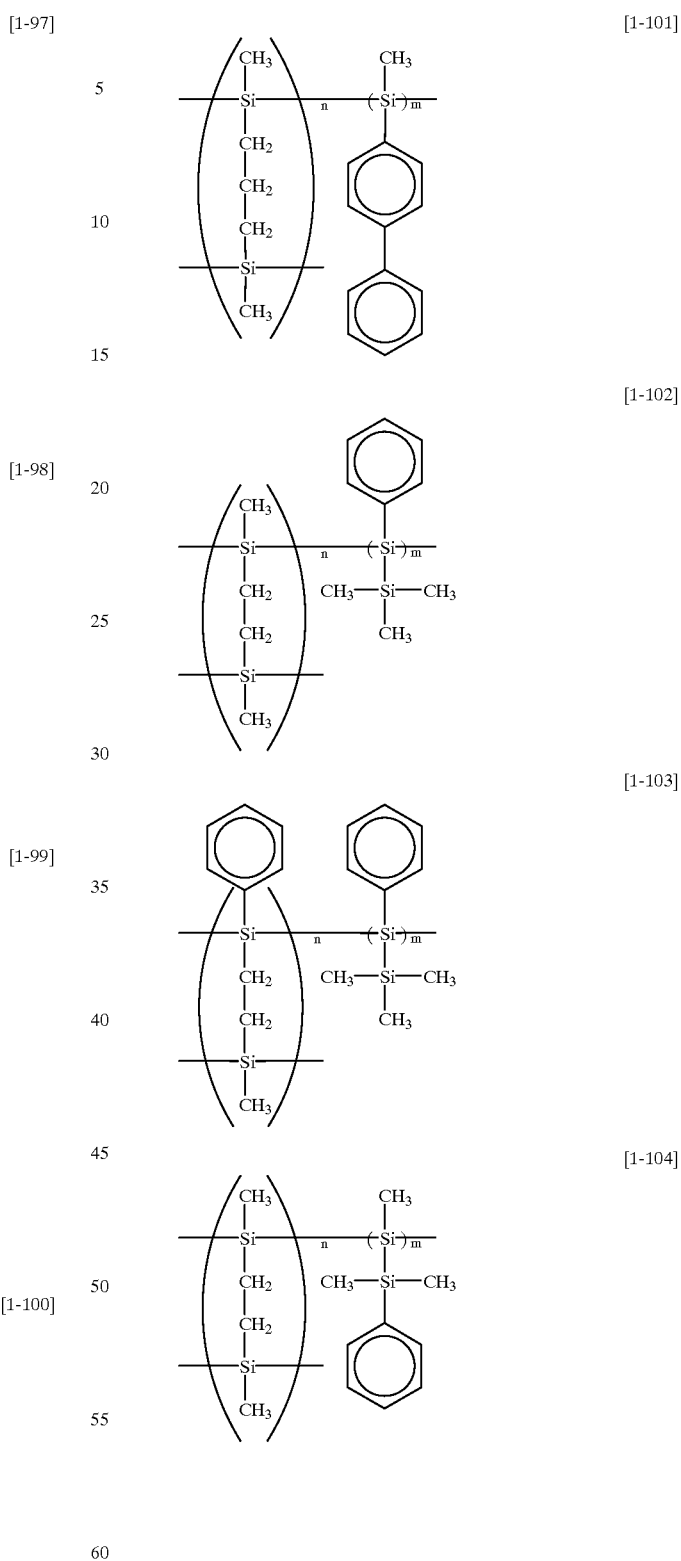

[1-105] 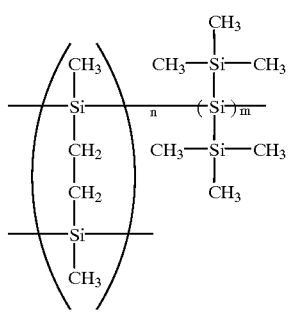
[1-106] 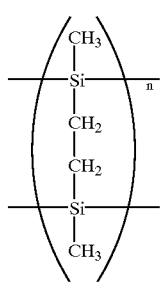
[1-107] 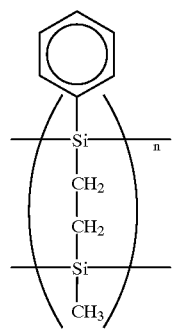
[1-108] 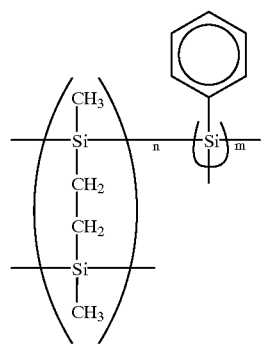
[1-109] 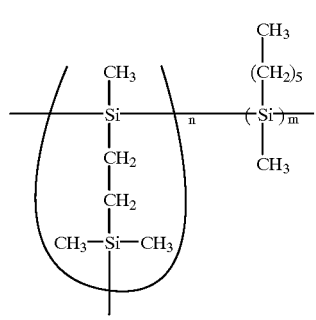
[1-110] 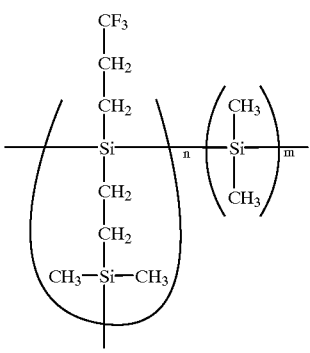
[1-111] 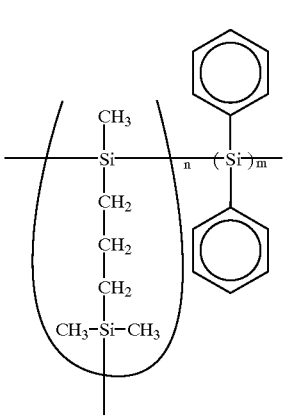
[1-112] 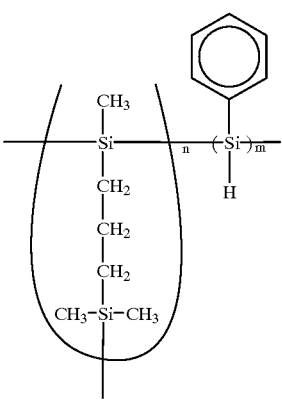
[1-113] 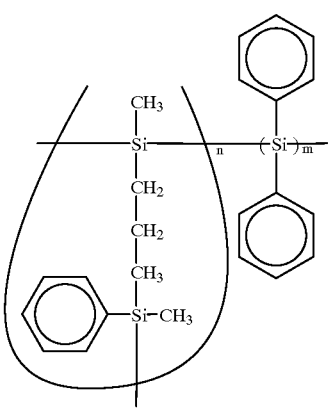

-continued

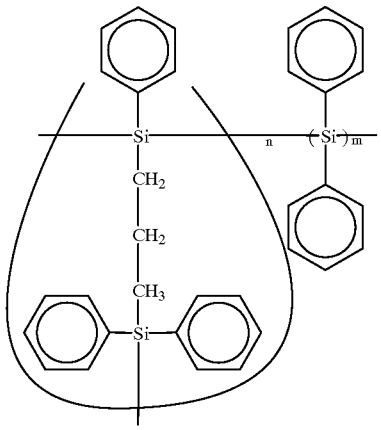

[1-114]

By the way, if only polysilane is employed, carbon may possibly enter into a silicon thin film to be formed. Whereas, when polycrystalline silicon fine particles are employed together with a predetermined state of polysilane, the aforementioned problem can be overcome.

In this case, the particle diameter of the raw polycrystalline silicon fine particles should preferably be confined to the range of 0.1 to 30 $\mu$m.

Figure 7A:
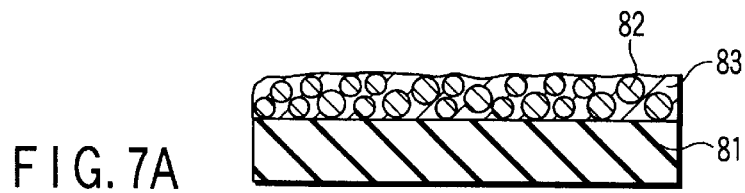
FIGS. 7A and 7B are cross-sectional views each illustrating another example of the method of forming a polycrystalline silicon thin layer according to this invention.
Figure 7B:
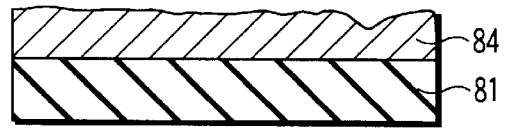

FIGS. 7A and 7B show cross-sectional views each illustrating another example of the method of forming a polycrystalline silicon thin layer according to this invention. First of all, as shown in FIG. 7A, particulate silicon 82 is mixed with liquid or gel-like polysilane 83 to be acted as a binder to form a mixture, which is then kneaded to form a paste. Then, this paste is coated on the surface of a substrate 81 to form a film. Alternatively, polysilane may be dissolved in a solvent before use. The resultant coated film is then baked to form a deposited film.

The deposited film thus obtained is constructed such that Si particles are crosslinked with each other according to the Si skeleton structure of polysilane, and the side chain structure thereof is dissociated due to the heat treatment. As a result, the deposited film becomes a silicon thin film deposition product as shown in FIG. 7B, thus obtaining a silicon film 84.

When the silicon film thus obtained is recrystallized in the same manner as explained above, it can be turned into a polycrystalline silicon thin film containing silicon particles having an enlarged crystal grain diameter.

Alternatively, it is also possible to directly coat polysilane on the surface of substrate without employing particulate silicon. Specifically, after polysilane is coated on the surface of substrate, the resultant thin film may be rolled by making use of a member such as a roller.

Figure 8A:
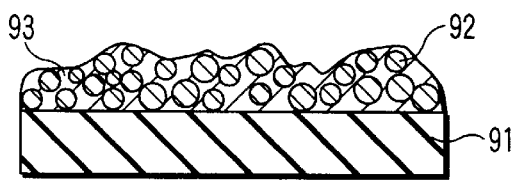
FIGS. 8A to 8C are cross-sectional views each illustrating still another example of the method of forming a polycrystalline silicon thin layer according to this invention.
Figure 8B:
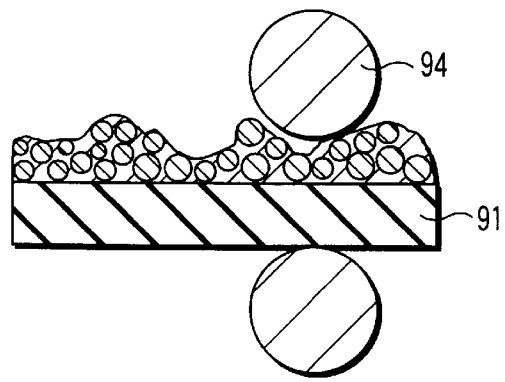
Figure 8C:
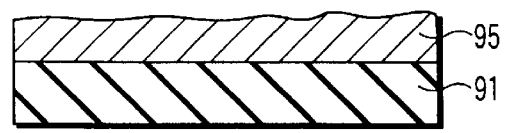

FIGS. 8A to 8C show cross-sectional views each schematically illustrating the steps of the aforementioned method. First of all, as shown in FIG. 8A, polysilane 93 containing particulate silicon 92 is coated on the surface of a substrate 91 to form a thin film. Then, the thin film is rolled by making use of a roller 94 as shown in FIG. 8B. As a result, a uniform thin film having a high density can be obtained. Subsequently, this thin film is heat-treated to obtain a silicon film 95 as shown in FIG. 8C.

When a silicon layer is formed by the method as shown in FIGS. 8A to 8C, the thickness of silicon layer can be easily controlled to several micrometers. Moreover, since the processes of coating/rolling/heat-treating/recrystallization can be successively performed under the atmospheric pressure, the method is very advantageous in terms of mass-production.

There is another method as an alternative thin film deposition method, wherein a melt of silicon is directly poured over the surface of substrate and then quenched. FIGS. 9A and 9B show cross-sectional views schematically illustrating the steps of the aforementioned method. Since silicon is introduced in a molten state over the surface of substrate, the substrate is required to be excellent in heat resistance. Specifically, the substrate is required to be stable at a temperature of 1412° C. (the melting point of silicon) or more. For example, graphite is excellent in heat resistance, so that it is very suited for use in this method.

First of all, a graphite substrate 101 is heated to 1,200° C. and then maintained at this temperature by making use of a heater 102 which is disposed below the graphite substrate 101. Then, silicon melt 103 is poured from a silicon melt tank 104 to the surface of the graphite substrate 101. Thereafter, the silicon melt 103 thus poured is quenched thereby to form a silicon thin film 105 as shown in FIG. 9B.

The silicon thin film thus formed is then subjected to a recrystallization process as mentioned above so as to enlarge the crystal grain diameter. It is desired, in view of controlling the thickness and uniformity of the silicon thin film, to enhance the wettability between the silicon melt and the substrate. The improvement of this wettability can be effectively achieved by the formation in advance of a buffering layer consisting of an oxide such as $SiO_2$ or MgO on the surface of the substrate. As for the method of pouring a silicon melt, it is also possible to employ a method wherein the substrate 101 is allowed to contact with the surface or interior of the silicon melt 103 filled in the silicon melt tank 104, thereby forming a silicon thin film on the surface of substrate.

Next, the process of recrystallization as a method for enlarging the crystal grain diameter of the deposited silicon thin film will be explained.

For example, it is possible to enlarge an average grain diameter of silicon crystal by making use of a method wherein a linear beam from a halogen lamp is irradiated onto the deposited silicon layer thereby to partially melt the silicon layer, and then the molten portion of the silicon layer is quenched. By the way, if the surface of the deposited silicon film is heated to melt without preliminarily applying a coating on the surface of the deposited silicon film in the step of recrystallizing the thin silicon film, the molten portion may be balled up due to the surface tension of silicon, thus making it difficult to recrystallize the thin silicon film while ensuring a uniform film. Therefore, it is suggested by this invention to cover the surface of the thin deposition film with $SiO_2$, and a linear beam from a halogen lamp is irradiated through this $SiO_2$ film onto the thin deposition film to heat and melt the thin deposition film, thus overcoming the aforementioned problem.

FIGS. 10A to 10C show cross-sectional views schematically illustrating the process of recrystallization.

First of all, as shown in FIG. 10A, a silicon film 112 is formed on a substrate 111. Then, an $SiO_2$ covering layer 113 is formed on the surface of the silicon film 112 as shown in FIG. 10B. Thereafter, as shown in FIG. 10C, a linear beam from a halogen lamp 114 is irradiated onto the surface of the substrate 111 while heating the substrate 111 by means of a heater 116. As a result, a light-converged heated portion 115 of the silicon film 112 is partially fused. Thereafter, this fused portion is quenched to obtain a polycrystalline silicon thin layer having an enlarged crystal grain diameter.

In contrast to the ordinary method of forming $SiO_2$ by means of CVD, the method of this invention is featured in that polysilazane is coated on the surface of a deposited silicon layer, and then heat-treated to form an $SiO_2$ film to be utilized as a covering layer. Therefore, the process speed can be extremely enhanced as compared with the conventional method, and at the same time, it has become possible to continuously perform a sequence of processes beginning from the formation of an $SiO_2$ film to the recrystallization.

The heat treatment for depositing the $SiO_2$ film after the coating of polysilazane may be considered as a preliminary heating prior to the recrystallization. It has become possible, with this continuous process, to prevent the deposited silicon layer from being contaminated with impurities and to effectively carry out the recrystallization.

When the deposited silicon layer is irradiated by the halogen lamp 114 as shown in FIG. 10B, the temperature of the surface region of the deposited silicon layer to which the converged light is irradiated may become as high as about 1,500° C. However, since the deposited silicon layer can be heated from the reverse surface side thereof, it is possible to make the temperature gradient suitable for the melting-recrystallization. As shown in FIG. 11, it is desired to pay attention in particular to the temperature gradient in the direction along which the recrystallization proceeds. In this regard, it is preferable to employ a method wherein a cooling gas is blown from above the substrate in such a manner that the temperature of the portion 10 mm away from the molten tip portion becomes 1,200° C.

By the way, the employment of a heat resistant substrate is required in order to carry out the deposition of the polycrystalline silicon thin film and the recrystallization of the deposited silicon thin film. Although there have been many attempts to employ various kinds of substrate, these attempts still failing to find out any decisive material meeting the conditions of low cost, high efficiency and high heat resistance. Whereas, this invention is suggesting a solution to these problems. Namely, according to this invention, it is suggested to employ, as a heat resistant substrate, a metallic substrate such as steel, stainless steel, etc., which are low in cost, high in melting point, thus meeting the object of this invention.

However, when a silicon film is directly deposited on the surface of these metallic substrates, a transition metal such as Fe may diffuse from the substrate into the deposited silicon film during a high temperature processing. Since the transition metal included in the silicon film becomes a carrier killer center, the power generating efficiency would be extremely deteriorated. Therefore, according to this invention, the surface of metallic substrate is coated with a ceramic material such as $SiO_2$. Therefore, it has become possible with this structure to enable the metallic substrate to function as a supporting material, while enabling the ceramic material to function to prevent the diffusion of impurities.

Moreover, another advantage of the aforementioned structure is that when the ceramic film formed on the metallic substrate is formed into a pattern thereby to partially expose the surface of the substrate, the exposed portion of the metallic substrate can be utilized as an electrode. Namely, it is possible to directly contact the exposed portion of the metallic substrate with the silicon film, thereby enabling the silicon film to be electrically connected with the substrate.

Figure 12A:
FIGS. 12A to 12D are cross-sectional views illustrating one example of the manufacturing process of a solar power generating element.
Figure 12B:
Figure 12C:
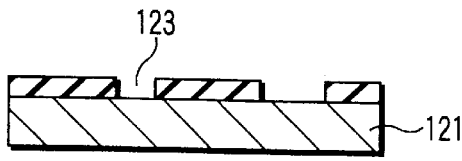
Figure 12D:

FIGS. 12A to 12D show cross-sectional views illustrating the manufacturing process of a substrate provided with a patterned ceramic film. First of all, as shown in FIG. 12A, a metallic substrate 121 formed of a steel or a stainless steel is prepared. Then, as shown in FIG. 12B, a ceramic film 122 is formed on the surface of the metallic substrate 121. Thereafter, as shown in FIG. 12C, the ceramic film 122 is patterned thereby to partially expose the surface of the metallic substrate 121, thus forming an opening 123.

Subsequently, a silicon deposition film 124 is formed on the surfaces of the patterned ceramic film and of the substrate in the same manner as explained above.

The silicon film 124 thus formed is directly contacted with part of the metallic substrate 121, whereby slightly allowing impurities in the substrate to diffuse via this contacted portion into the silicon film 124. However, since the range of this diffusion is limited to the region around the removed portion of the ceramic film, the influence of the diffusion on the power generating efficiency is fur smaller as compared with the case where the silicon film is entirely contacted with the metallic substrate.

Figure 13:
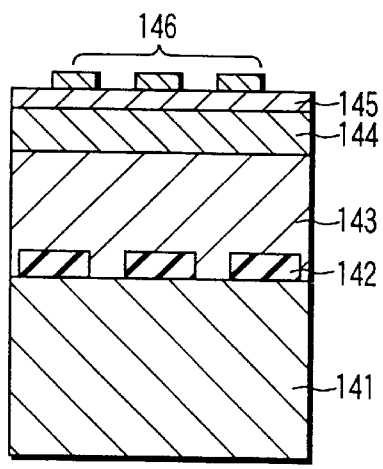
FIG. 13 is a cross-sectional view illustrating another example of a solar power generating element according to this invention.

FIG. 13 shows a cross-sectional view illustrating one example of a solar power generating element of this invention, wherein a silicon film to be obtained according to the aforementioned method is employed as a power generating layer. As shown in FIG. 13, a patterned ceramic film 142 is formed on the surface of a metallic substrate 141. Further, a p-type silicon deposition layer 143 and an n-type silicon layer 144 are successively formed on the patterned ceramic film 142. Moreover, a ZnO layer 145 and a collector electrode 146 are successively formed on the n-type silicon layer 144.

Figure 14:
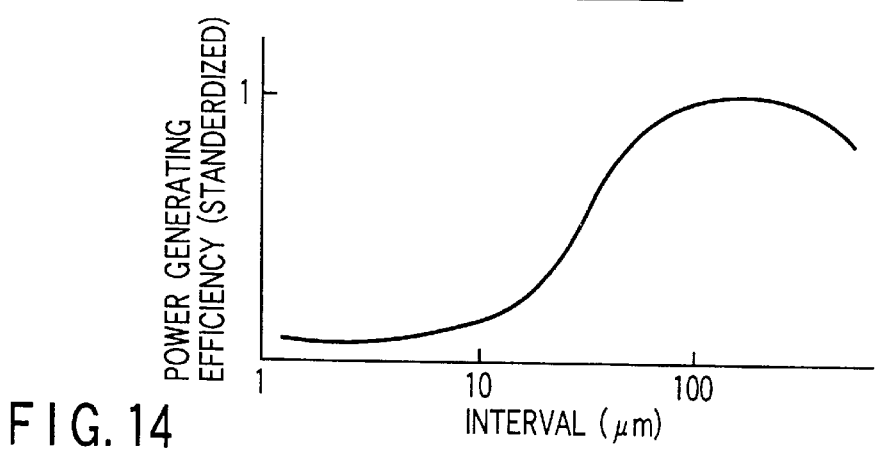
FIG. 14 is a graph illustrating the relationship between the interval of the openings and the power generating efficiency.

FIG. 14 shows a graph illustrating the relationship between the interval of the openings or the removed portions of the ceramic film (the width of pattern) where the width of the removed portion was set to 5 μm and the power generating efficiency of a solar power generating element which was manufactured using the aforementioned metallic substrate. As seen from FIG. 14, when the interval is relatively long, the influence thereof on the life time of minority carrier is relatively small.

Figure 15:
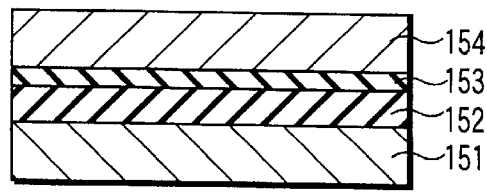
FIG. 15 is a cross-sectional views illustrating another example of the polycrystalline silicon thin layer in the solar power generating element of this invention.

As for the material for the ceramic film to be formed on the surface of a metallic substrate according to the aforementioned method, $SiO_2$ is preferable in view of easiness in the formation of film and in handling. Alternatively, a silicon film 154 may be formed after an MgO film 153 is deposited on the surface of an $SiO_2$ film 152 formed on a metallic substrate 151 as shown in FIG. 15. It is possible with this structure to more effectively inhibit the diffusion of Fe from the metallic substrate 151 into the silicon film 154.

Figure 16:
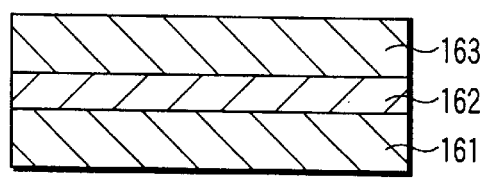
FIG. 16 is a cross-sectional views illustrating still another example of the polycrystalline silicon thin layer in the solar power generating element of this invention.

Further, in view of the wettability to silicon, the employment of zirconia ($ZrO_2$) as a ceramic film is also preferable since it is relatively low in cost and enables a conductive thin film to be formed. For example, as shown in FIG. 16, a silicon layer 163 can be deposited without requiring the removal partially of a zirconia film 162 that has been formed on a metallic substrate 161, and hence the silicon layer 163 can be deposited without contacting with the metallic substrate 161.

As explained above, it is possible according to this invention to provide a method which enables to form, with a reduced consumption of raw material, a polycrystalline silicon thin layer to be employed as a power generating layer of a solar power generating element for realizing the manufacture of a high efficiency cell at low cost. Further, it is also possible according to this invention to provide a solar power generating element which is high in efficiency and low in manufacturing cost.

It is possible according to this invention to carry out the deposition of silicon and the melting recrystallization of silicon layer at low cost in the manufacture of a solar power generating element where a polycrystalline silicon thin layer is employed as a power generating layer. Moreover, it is possible to employ an inexpensive substrate. Conventionally, the saving of manufacturing cost for the solar cell has been hindered by a high cost of substrate. However, it has now become possible according to this invention to reduce the manufacturing cost for the solar cell.

Further, since a silicon fine particles can be deposited directly on a substrate in a deposition method not requiring a high vacuum in the step of depositing silicon, it is possible to simplify the manufacturing facility, maintenance and operation. Additionally, the covering of silicon dioxide at the occasion of recrystallization can be easily achieved by making use of polysilazane.

Although the substrate is required to be excellent in heat resistance and to be effective in preventing the diffusion of impurities throughout the processes of deposition and recrystallization, these problems can be overcome by the employment of a carbon substrate or a metallic substrate, which are excellent in heat resistance. For example, the diffusion of impurities from a metallic substrate can be inhibited by covering the surface of the metallic substrate with a coating material selected from silicon dioxide, magnesium oxide, zirconia and silicon nitride. On the other hand, the carbon substrate can be dispensed with these coating materials, and hence more advantageous.

The method of this invention is very effective in the formation of a power generating layer of a solar power generating element, while the solar power generating element of this invention is excellent in property and capable of overcoming all of the problems accompanied with the conventional solar power generating element, and hence this invention is very valuable in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a polycrystalline silicon thin layer, which comprises the steps of:
    a) forming a silicon thin film having a thickness of not more than 30 μm on a surface of a heat resistant substrate which is not decomposed with heat by making use of polycrystalline silicon fine particles as a raw material; and
    b) heating said silicon thin film thereby to recrystallize said silicon thin film and hence to enlarge an average grain diameter of said polycrystalline silicon fine particles;
    wherein a particle diameter (r) of said raw silicon fine particles is not more than 3 times of said thickness (d) of a silicon film to be deposited on said heat resistant substrate; and
    wherein said silicon thin film is formed by depositing said polycrystalline silicon fine particles directly on the surface of said substrate, and satisfies a relationship represented by the following formula (1):

$$W_A/(V_S \cdot d_S) \geq 0.95 \tag{1}$$

wherein $W_A$ is the weight of said polycrystalline silicon fine particles which is actually deposited on the surface of said substrate; $V_S$ is a volume of said silicon thin film which is deposited on the surface of the substrate; and $d_S$ is a density of silicon (Si).

2. The method of forming the polycrystalline silicon thin layer according to claim 1, wherein said step of forming the silicon thin film is performed by the steps comprising:
    a) disposing said heat resistant substrate in a silicon melt-deposition apparatus;
    b) spraying said polycrystalline silicon fine particles in a plasma generating region inside said silicon melt-deposition apparatus thereby to liquefy or vaporize said polycrystalline silicon fine particles;
    c) cooling said vaporized polycrystalline silicon fine particles; and
    d) allowing silicon in a state of liquid to be deposited on a surface of said heat resistant substrate thereby to solidify the liquid silicon.

3. The method of forming a polycrystalline silicon thin layer according to claim 1, wherein a thickness of said silicon thin film to be formed on the surface of said heat resistant substrate is in the range of 3 μm to 30 μm.

4. The method of forming a polycrystalline silicon thin layer according to claim 1, wherein said heat resistant substrate is a carbon substrate.

5. The method of forming a polycrystalline silicon thin layer according to claim 1, wherein which further comprises, prior to the step of forming said silicon thin film on the surface of said heat resistant substrate, a step of forming a film of at least one material selected from the group consisting of silicon dioxide, magnesium oxide, zirconia and silicon nitride on at least a portion of the surface of said heat resistant substrate.

6. The method of forming a polycrystalline silicon thin layer according to claim 1, wherein said silicon thin film is formed at a pressure of 0.1 atm or more of an atmosphere containing an inert gas or hydrogen gas.

7. The method of forming a polycrystalline silicon film layer according to claim 1, wherein said polycrystalline silicon thin layer is formed of a boron-doped p-type crystal.

8. The method of forming a polycrystalline silicon film layer according to claim 2, wherein said plasma generating region generates a plasma using a high frequency induction system or a microwave.

9. The method of forming a polycrystalline silicon film layer according to claim 1, wherein said silicon thin film to be formed has a thickness of from 5 to 20 μm.

10. A method of forming a polycrystalline silicon thin layer, which comprises the steps of:
    a) forming a silicon thin film having a thickness of not more than 30 μm on a surface of a heat resistant substrate which is not decomposed with heat by making use of polycrystalline silicon fine particles as a raw material; and
    b) heating said silicon thin film thereby to recrystallize said silicon thin film and hence to enlarge an average grain diameter of said polycrystalline silicon fine particles;
    wherein a particle diameter (r) of said raw silicon fine particles is not more than 3 times of said thickness (d) of a silicon film to be deposited on said heat resistant substrate, and
    wherein said silicon thin film is formed by coating or depositing a mixture containing said polycrystalline silicon fine particles on the surface of said heat resistant substrate; and meets a relationship represented by the following formula (1):

$$W_A/(V_S \cdot d_S) \geq 0.95 \qquad (1)$$

wherein $W_A$ is the weight of said polycrystalline silicon fine particles which is actually deposited on the surface of said substrate; $V_S$ is a volume of said silicon thin film which is deposited on the surface of said substrate; and $d_S$ is a density of silicon (Si), said mixture being formed of said polycrystalline silicon fine particles and a material selected from the group consisting of a solution of a polysilane compound in a solvent, a liquid polysilane compound and a gel-form polysilane compound.

11. The method of forming a polycrystalline silicon thin layer according to claim 10, wherein a thickness of said silicon thin film to be formed on the surface of said heat resistant substrate is in the range of 3 µm to 30 µm.

12. The method of forming a polycrystalline silicon thin layer according to claim 10, wherein said heat resistant substrate is a carbon substrate.

13. The method of forming a polycrystalline silicon thin layer according to claim 10, wherein which further comprises, prior to the step of forming said silicon thin film on the surface of said heat resistant substrate, a step of forming a film of at least one material selected from the group consisting of silicon dioxide, magnesium oxide, zirconia and silicon nitride on at least a portion of the surface of said heat resistant substrate.

14. The method of forming a polycrystalline silicon thin layer according to claim 10, wherein an average particle diameter of said raw polycrystalline silicon fine particles is in the range of 0.1 µm to 30 µm.

15. The method of forming a polycrystalline silicon film layer according to claim 10, wherein said polycrystalline silicon thin layer is formed of a boron-doped p-type crystal.

16. The method of forming a polycrystalline silicon film layer according to claim 10, wherein said silicon thin film to be formed has a thickness of from 5 to 20 µm.

17. A method of forming a polycrystalline silicon thin layer for a solar cell, which comprises the steps of:

a) forming a silicon thin film on a surface of a heat resistant substrate which is not decomposed with heat by making use of polycrystalline silicon fine particles as a raw material; and b) heating said silicon thin film thereby recrystallize said silicon thin film and hence to enlarge an average grain diameter of said polycrystalline silicon fine particles; wherein a particle diameter (r) of said raw silicon fine particles is not more than 3 times of said thickness (d) of a silicon film to be deposited on said heat resistant substrate, and wherein said silicon thin film is formed by depositing said raw polycrystalline silicon fine particles having an average particle diameter ranging from 1 µm to 100 µm directly on the surface of said heat resistant substrate; and satisfies a relationship represented by the following formula (1):

$$W_A/(V_S \cdot d_S) \geq 0.95 \qquad (1)$$

wherein $W_A$ is the weight of the polycrystalline silicon fine particles which is actually deposited on the surface of said substrate; $V_S$ is a volume of said silicon thin film which is deposited on the surface of the substrate; and $d_S$ is a density of silicon (Si).

18. The method of forming a polycrystalline silicon thin layer according to claim 17, wherein a thickness of said silicon thin film to be formed on the surface of said heat resistant substrate is in the range of 3 µm to 30 µm.

19. The method of forming a polycrystalline silicon thin layer according to claim 17, wherein said heat resistant substrate is a carbon substrate.

20. The method of forming a polycrystalline silicon thin layer according to claim 17, wherein which further comprises, prior to the step of forming said silicon thin film on the surface of said heat resistant substrate, a step of forming a film of at least one material selected from the group consisting of silicon dioxide, magnesium oxide, zirconia and silicon nitride on at least a portion of the surface of said heat resistant substrate.

21. The method of forming a polycrystalline silicon thin layer according to claim 17, wherein said polycrystalline silicon thin layer is formed of a boron-doped p-type crystal.

22. The method of forming a polycrystalline silicon thin layer according to claim 17, wherein said step of forming a silicon thin film is performed by the steps comprising:

a) disposing said heat resistant substrate in a silicon-melt deposition apparatus;

b) spraying said polycrystalline silicon fine particles in a plasma generating region inside said silicon melt-deposition apparatus thereby to liquify or vaporize said polycrystalline silicon fine particles;

c) cooling said vaporized polycrystalline silicon fine particles; and d) allowing silicon in a state of liquid to be deposited on a surface of said heat-resistant substrate thereby to solidify the liquid silicon.

23. The method of forming a polycrystalline silicon thin layer according to claim 22, wherein said plasma generating region generates a plasma using a high frequency induction system or microwave.

24. The method of forming a polycrystalline silicon film layer according to claim 17, wherein said silicon thin film to be formed has a thickness of from 5 to 20 µm.

* * * * *